(12) United States Patent
Ogihara

(10) Patent No.: US 11,670,514 B2
(45) Date of Patent: *Jun. 6, 2023

(54) METHOD FOR MANUFACTURING SEMICONDUCTOR DEVICE AND SEMICONDUCTOR SUBSTRATE

(71) Applicant: FILNEX INC., Tokyo (JP)

(72) Inventor: Mitsuhiko Ogihara, Tokyo (JP)

(73) Assignee: FILNEX INC., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/477,538

(22) Filed: Sep. 17, 2021

(65) Prior Publication Data

US 2022/0005699 A1 Jan. 6, 2022

Related U.S. Application Data

(63) Continuation of application No. 17/002,781, filed on Aug. 26, 2020, now Pat. No. 11,152,216, which is a
(Continued)

(30) Foreign Application Priority Data

Feb. 28, 2018 (JP) .............................. JP2018-035221

(51) Int. Cl.
*H01L 21/306* (2006.01)
*H01L 21/02* (2006.01)
*H01L 21/20* (2006.01)

(52) U.S. Cl.
CPC ...... *H01L 21/306* (2013.01); *H01L 21/02112* (2013.01); *H01L 21/02667* (2013.01); *H01L 21/20* (2013.01)

(58) Field of Classification Search
None
See application file for complete search history.

(56) References Cited

U.S. PATENT DOCUMENTS 11,152,216 B2 * 10/2021 Ogihara ............ H01L 21/02002
2009/0239361 A1 9/2009 Igari et al.
(Continued)

FOREIGN PATENT DOCUMENTS

JP H9148206 A 6/1997
JP 200368995 A 3/2003
(Continued)

OTHER PUBLICATIONS

International Search Report in PCT Application No. PCT/JP2018/012370, dated Jul. 3, 2018, 5pp.
(Continued)

*Primary Examiner* — Alexander G Ghyka
(74) *Attorney, Agent, or Firm* — Hauptman Ham, LLP

(57) ABSTRACT

A method for manufacturing a semiconductor device includes the steps of forming a fixing layer, coupling a third substrate different from the first substrate and the second substrate to the fixing layer, separating the semiconductor thin film layer from the first substrate by moving the third substrate away from the base material substrate with the third substrate coupled to the coupling region, and bonding the semiconductor thin film layer to the second substrate after separation from the base material substrate, wherein the forming the fixing layer forms the fixing layer having a thickness such that a crack is generated between the fixing layer formed on the first substrate and the fixing layer formed on a side surface of the semiconductor thin film layer by a force for moving the third substrate.

6 Claims, 36 Drawing Sheets

Related U.S. Application Data continuation of application No. PCT/JP2018/012370, filed on Mar. 27, 2018.

(56) References Cited

U.S. PATENT DOCUMENTS

| | | |
|---|---|---|
| 2010/0237380 A1 | 9/2010 | Tanaka |
| 2011/0048611 A1* | 3/2011 | Carre .................. H01L 21/6835 |
| | | 156/73.1 |
| 2011/0146791 A1 | 6/2011 | Teplin et al. |
| 2011/0171813 A1 | 7/2011 | Rogers et al. |
| 2014/0203300 A1 | 7/2014 | Hatayama et al. |
| 2014/0345794 A1 | 11/2014 | Ko et al. |
| 2016/0163917 A1 | 6/2016 | Lu et al. |
| 2018/0108524 A1 | 4/2018 | Lin |
| 2019/0189845 A1 | 6/2019 | Yoon et al. |
| 2020/0227263 A1 | 7/2020 | Kubota et al. |
| 2020/0274022 A1 | 8/2020 | Chiu et al. |
| 2022/0148921 A1* | 5/2022 | Ogihara ................ H01L 21/185 |

FOREIGN PATENT DOCUMENTS

| | | |
|---|---|---|
| JP | 2003249631 A | 9/2003 |
| JP | 3813123 B2 | 8/2006 |
| JP | 2009152387 A | 7/2009 |
| JP | 2010225668 A | 10/2010 |
| JP | 2010258352 A | 11/2010 |
| JP | 2015126188 A | 7/2015 |
| JP | 201640828 A | 3/2016 |
| TW | 200832513 A | 8/2008 |
| WO | 2013031172 A1 | 3/2013 |
| WO | 2015013864 A1 | 2/2015 |

OTHER PUBLICATIONS

Office Action in TW Application No. 108106385, dated Apr. 26, 2019, 6pp.

Written Opinion in PCT Application No. PCT/JP2018/012370, dated Jul. 3, 2018, 11pp.

* cited by examiner

⟨112⟩ orientation of Si (111) or
⟨1-100⟩ orientation of GaN

METHOD FOR MANUFACTURING SEMICONDUCTOR DEVICE AND SEMICONDUCTOR SUBSTRATE

CROSS-REFERENCE TO RELATED APPLICATIONS

The present application is a continuation application of U.S. patent application Ser. No. 17/002,781, filed on Aug. 26, 2020, which is a continuation application of International Application number PCT/JP2018/012370, filed on Mar. 27 2018, which claims priority under 35 U.S.C § 119(a) to Japanese Patent Application No. 2018-035221, filed on Feb. 28, 2018. The contents of these applications are incorporated herein by reference in their entirety.

BACKGROUND

This invention relates to a method for manufacturing a semiconductor device. Japanese Patent No. 3813123 discloses a technique of detaching a semiconductor epitaxial layer from a base material substrate and transferring the semiconductor epitaxial layer to another substrate.

FIG. 22 is a figure for explaining the prior art. FIG. 22 shows a semiconductor structure composed of a base material substrate 3001, a sacrificial layer 3002, a semiconductor epitaxial layer 3003, and a support body 3004. The sacrificial layer 3002 is provided between the semiconductor epitaxial layer 3003 and the base material substrate 3001, and is smaller than the semiconductor epitaxial layer 3003 due to etching. The reference numeral 3010 indicates a region where the sacrificial layer 3002 has been etched away.

The support body 3004 has the same horizontal cross section as the semiconductor epitaxial layer 3003, and is provided on the semiconductor epitaxial layer 3003. The support body 3004 is a member for supporting the semiconductor epitaxial layer 3003 when detaching the semiconductor epitaxial layer 3003 from the base material substrate 3001. In the conventional technique shown in FIG. 22, the sacrificial layer 3002 is etched away to peel off the semiconductor epitaxial layer 3003 from the base material substrate 3001.

In the conventional technique shown in FIG. 22, the semiconductor epitaxial layer 3003 and the support body 3004 are peeled off from the base material substrate 3001 at the time when the sacrificial layer 3002 is completely etched away. Therefore, there is a problem that the semiconductor epitaxial layer 3003 has to be transferred and placed in a temporary place different from the base material substrate 3001 at the time when the sacrificial layer 3002 is completely etched away and the semiconductor epitaxial layer 3003 is separated from the base material substrate 3001.

SUMMARY

The present invention focuses on this point, and an object thereof is to improve the efficiency of a method for manufacturing a semiconductor device by bonding a semiconductor epitaxial layer to another substrate.

A method for manufacturing a semiconductor device in which a semiconductor thin film layer formed on a first substrate is separated from the first substrate and bonded onto a second substrate different from the first substrate, the method comprises steps of forming a fixing layer that is a thin film for coupling at least a portion of a main surface of the semiconductor thin film layer on the side opposite to a first substrate side and at least a portion of the surface of the first substrate on a semiconductor thin film layer side, coupling a third substrate different from the first substrate and the second substrate to the coupling region that is at least portions of the fixing layer and the semiconductor thin film layer, separating the semiconductor thin film layer from the first substrate by moving the third substrate away from the first substrate with the third substrate coupled to the coupling region, and bonding the semiconductor thin film layer to the second substrate after separation from the first substrate, wherein the forming the fixing layer forms the fixing layer having a thickness such that a crack is generated between the fixing layer formed on the first substrate and the fixing layer formed on a side surface of the semiconductor thin film layer by a force for moving the third substrate.

DETAILED DESCRIPTION OF THE INVENTION

Hereinafter, the present invention will be described through exemplary embodiments of the present invention, but the following exemplary embodiments do not limit the invention according to the claims, and not all of the combinations of features described in the exemplary embodiments are necessarily essential to the solution means of the invention.

<An Outline of a Method for Manufacturing a Semiconductor Device>

In a method for manufacturing a semiconductor device according to the present embodiment, a semiconductor thin film layer island on a base material substrate, which is a first substrate, is transferred to a destination substrate, which is a second substrate, thereby manufacturing a semiconductor device having the destination substrate and a semiconductor thin film layer. The "semiconductor thin film layer island" is a region of the semiconductor thin film layer having the size same as the base material substrate, or a region of the semiconductor thin film layer smaller than the base material substrate. A single semiconductor thin film layer island or a plurality of semiconductor thin film layer islands may be formed on a single base material substrate.

The method for manufacturing the semiconductor device according to the present embodiment is characterized in that a fixing layer supporting the semiconductor thin film layer island separated from the base material substrate is formed, and so the semiconductor thin film layer island that is separated from the base material substrate to be transferred to the destination substrate can be maintained in a stable stale above the base material substrate. Thus, it is possible to transfer the separated semiconductor thin film layer island to the second substrate by connecting the semiconductor thin film layer island to an organic material layer formed on a pick-up substrate, which is a third substrate, and then separating the semiconductor thin film layer island from the base material substrate.

<A Process of Detaching the Semiconductor Thin Film Layer Island from the Base Material Substrate>

FIGS. 1A to 1E are figures for explaining a process of detaching the semiconductor thin film layer island from the base material substrate. Hereinafter, an outline of the process of detaching the semiconductor thin film layer island from the base material substrate will be described while referencing FIGS. 1A to 1E.

Figure 1A:
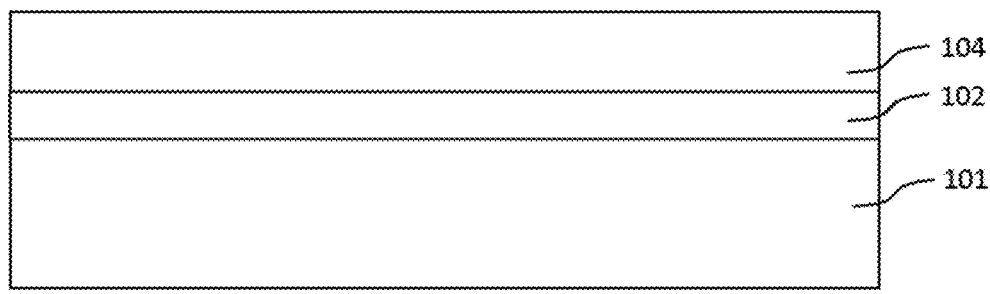
FIG. 1A is a figure for explaining a process of detaching a semiconductor thin film layer island from a base material substrate.

First, as shown in FIG. 1A, a layer to be removed 102 is formed on a base material substrate 101, which is the first substrate, and a semiconductor thin film layer 104, which is a semiconductor epitaxial layer, is formed on the layer to be removed 102. The layer to be removed 102 is a region to be removed by etching in a later step.

For example, the layer to be removed 102 is formed of a material having an etching rate different from that of the base material substrate 101 and the semiconductor thin film layer 104 when being etched using a predetermined etching method (wet etching using a predetermined etchant or dry etching using a predetermined gas). The layer to be removed 102 may be formed of a material equivalent to that of the base material substrate 101. For example, the layer to be removed 102 may be a partial region in the vicinity of the surface of the base material substrate 101.

The semiconductor thin film layer 104 is, for example, a semiconductor thin film layer formed by epitaxial growth or a semiconductor thin film layer formed by wafer bonding. The semiconductor thin film layer 104 may be a semiconductor thin film layer formed by other methods.

The semiconductor thin film layer 104 is, for example, a groupd III-V compound semiconductor material (such as GaAs, AlGaAs, InGaAs, InP, and InAlGaP), a group III nitride semiconductor material (such as GaN, InN, AlGaN, InGaN, and AlN), a dioxide semiconductor material (such as ZnO and $Ga_2O_3$), a group IV compound semiconductor material (such as SiC), a diamond, Si, or SiGe. The base material substrate 101 is, for example, a group III-V compound semiconductor material substrate (such as a GaAs substrate and an InP substrate), a group III nitride semiconductor material substrate (such as a GaN substrate), an oxide semiconductor material substrate (such as a ZnO substrate and a $Ga_2O_3$ substrate), a group IV compound semiconductor substrate (such as SiC), a diamond substrate, or Si, SiGe.

Figure 1B:
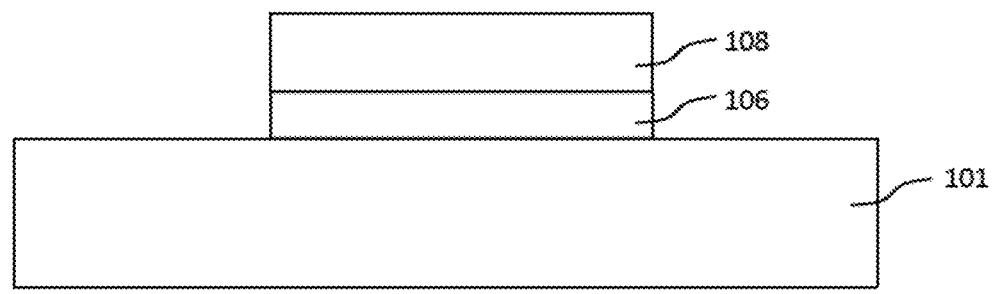
FIG. 1B is a figure for explaining the process of detaching the semiconductor thin film layer island from the base material substrate.

Subsequently, as shown in FIG. 1B, the semiconductor thin film layer 104 is divided into a plurality of island regions to form a semiconductor thin film layer island 108 (hereinafter, the "semiconductor thin film layer island 108" may be referred to as the "island 108"). The shape of the island 108 is not limited, but the following description exemplifies a case where the island 108 is rectangular. The island 108 may be, for example, square or hexagonal. It should be noted that, instead of dividing the semiconductor thin film layer 104 into a plurality of island regions, a single island 108 or a plurality of islands 108 may be formed by selectively growing the semiconductor thin film layer 104 on the base material substrate 101.

Further, a method for forming the island 108 is arbitrary, and can be exemplified by the following methods.
1) A method for forming the island 108 by processing a semiconductor thin film layer 104 with a photolithographic/etching process 2) A method for forming the island 108 by selectively growing the semiconductor thin film layer 104 on the base material substrate 101
3) A method for forming the island 108 by laterally growing the semiconductor thin film layer 104 in the lateral direction (horizontal direction) on the base material substrate 101

Hereinafter, one semiconductor thin film layer island 108 out of the plurality of semiconductor thin film layer islands 108 will be described. In this process, the island 108 may be formed including the layer to be removed 102, as shown in FIG. 1B. A region of the layer to be removed 102 included in the island 108 is a region to be removed 106 shown in FIG. 1B.

Figure 1C:
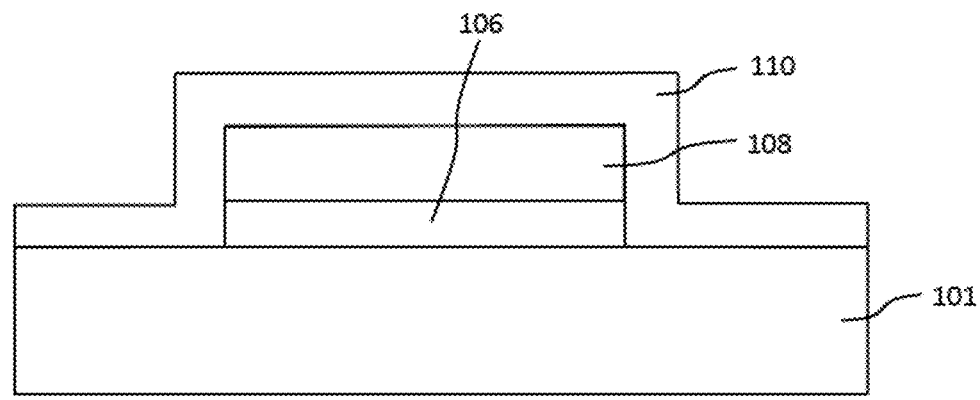
FIG. 1C is a figure for explaining the process of detaching the semiconductor thin film layer island from the base material substrate.
Figure 1D:
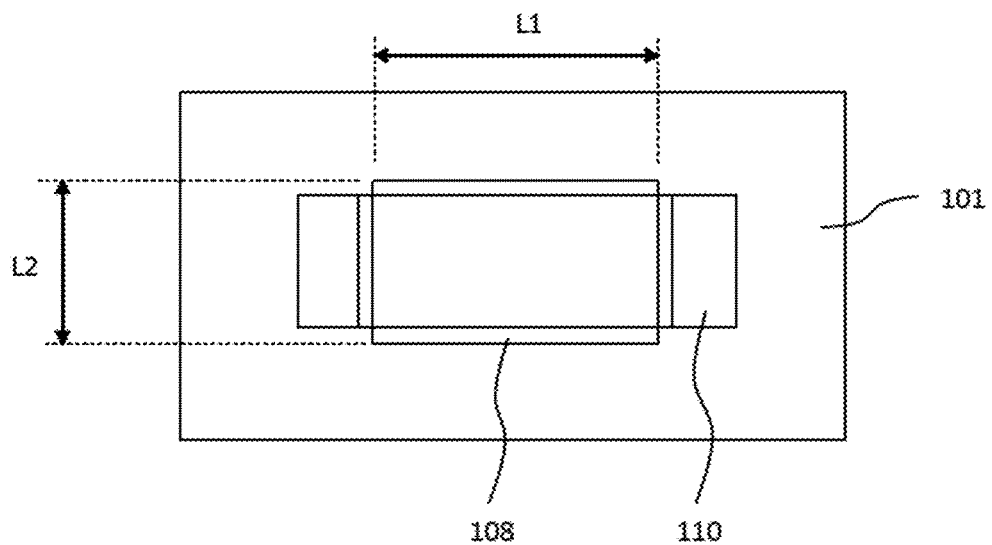
FIG. 1D is a figure for explaining the process of detaching the semiconductor thin film layer island from the base material substrate.

Subsequently, a fixing layer 110 is formed as shown in FIGS. 1C and 1D. The fixing layer 110 is a thin film lhat couples i) at lease a portion of a main surface of the island 108 on the side opposite the base material substrate 101 side and ii) at least a portion of the surface of the base material substrate 101 on the island 108 side. The fixing layer 110 has a shape, for example, extending from the upper surface of the island 108 to the base material substrate 101, but the fixing layer 110 may have other shapes, as long as the fixing layer 110 can couple the island 108 and the base material substrate 101. For example, the fixing layer 110 may be a film that couples the both of shorter side surfaces of the island 108 and the base material substrate 101. The fixing layer 110 may be a film that couples the both of longer side surfaces of the island 108 and the base material substrate 101. The fixing layer 110 may be composed of two thin films that couple the both of shorter side surfaces of the island 108 and the base material substrate 101. Further, the fixing layer 110 may be a thin film extending via both of the longer side surfaces of the island 108 so as to extend across the island 108, with the base material substrate 101 as a starting point and an ending point. In addition, the fixing layer 110 may be parallel to the side of the island 108, and may be formed to extend in a direction different from the orientation of the side of the island 108.

If the fixing layer 110 is formed to extend in the longitudinal orientation of the island 108, the fixing layer 110 is formed as follows in the process of forming the fixing layer 110: 1) the fixing layer 110 is formed to extend between both ends of the semiconductor thin film layer 104 in a first orientation (for example, an orientation connecting both side surfaces of the semiconductor thin film layer 104 that have a higher coverage by the fixing layer) on the main surface of the semiconductor thin film layer 104, and 2) the fixing layer 110 is formed such that the semiconductor thin film layer 104 is exposed in at least some regions on both side surfaces of the semiconductor thin film layer 104 in a second orientation orthogonal to the first orientation. If the island 108 is rectangular, the coverage of the longer side surfaces of the island 108 by the fixing layer 110 is less than the coverage of the shorter side surfaces by the fixing layer 110. This makes it possible to shorten the time required, when the etching described further below is performed, for removing i) a partial region of the island 108 or the base material substrate 101, or ii) a partial region of the layer between the island 108 and the base material substrate 101 in order to separate the island 108 and the base material substrate 101.

FIG. 1D is an overhead view corresponding to FIG. 1C. The fixing layer 110 serves to anchor the island 108 above the base material substrate 101 so that the position of the island 108 on the base material substrate 101 does not change at least directly below the island 108. The fixing layer 110 is a thin film layer made of a material having etching resistance against an etching means for etching the region to be removed 106.

As a material of the fixing layer 110, an inorganic insulating film such as an oxide film (such as $Si_xO_y$, $Si_xO_yN_z$, $Al_xO_y$, and $Al_xO_yN_z$) and a nitride film (such as $Si_xN_y$ and $Al_xN_y$) can be used, for example. The inorganic insulating film may be a single layer or a stack of different materials. For example, a desired fixing layer 110 can be formed by forming an inorganic insulating film using a Chemical Vapor Deposition (CVD) method and removing a pan of the inorganic insulating film by a standard photolithography and etching process. An organic film (such as a photosensitive coating film and a photosensitive organic sheet) may be used as the material of the fixing layer 110 as long as the organic film is resistant to the predetermined etching means for etching the region to be removed 106.

The optimum thickness of the fixing layer 110 can be selected according to the size and thickness of the semiconductor thin film layer island 108. The thickness of the fixing layer 110 is, for example, less than the thickness of the semiconductor thin film layer island 108 (that is, the thickness of the semiconductor thin film layer 104 formed on the base material substrate 101). The fixing layer 110 preferably has a thickness such that the fixing layer 110 formed on the side surfaces of the semiconductor thin film layer 104 is cut off from the fixing layer 110 formed on the base material substrate 101 by a force for moving a pick-up substrate 200, which is a third substrate to be described later, in a direction of being separated from the base material substrate 101, while the pick-up substrate 200 is coupled to at least portions of the coupling regions of the fixing layer 110 and the semiconductor thin film layer 104.

The semiconductor thin film layer island 108 shown in FIG. 1D has sides with lengths L1 and L2, where L1>L2. The fixing layer 110 has a first region covering the upper surface of the island 108, a second region covering the right side surface of the island 108, and a third region covering the left side surface of the island 108. The fixing layer 110 further has regions covering the base material substrate 101 beyond the second region and the third region. In the example shown in FIG. 1D, the fixing layer 110 does not cover the longer side surfaces (that is, the surfaces of the side having the length L1) and covers a portion of the shorter side surfaces (that is, the surfaces of the side having the length L2), out of the four side surfaces of the island 108.

Figure 1E:
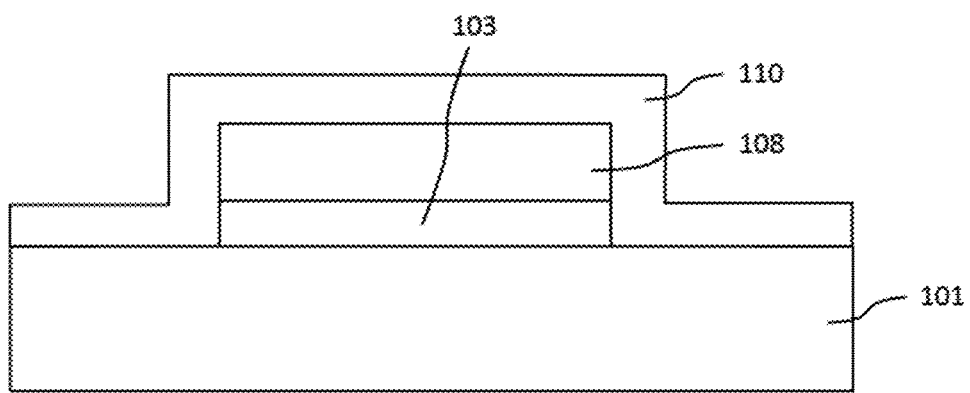
FIG. 1E is a figure for explaining the process of detaching the semiconductor thin film layer island from the base material substrate.

Subsequently, as shown in FIG. 1E, a void 103 is formed by removing i) a partial region of the island 108 or the base material substrate 101 or ii) a partial region of a layer to be removed between the island 108 and the base material substrate 101. For example, at least a region of the island 108, which is connected to the base material substrate 101 that is directly below the island 108, is etched away, thereby forming the void 103 at least in the region directly below the island 108 between the island 108 and the base material substrate 101. In forming the void 103, it is desirable to use an etchant or etching gas such that the etching rate of the island 108 for the etchant or the etching gas is smaller than that of the region to be removed 106.

In the above etching process, for example, if the etching of the layer to be removed proceeds isotropically and the etching rate is independent of the direction, the etching in the direction perpendicular to the longer side of the island 108 is completed faster than the etching in the direction perpendicular to the shorter side, since the distance in the direction perpendicular to the longer side is shorter than distance in the direction perpendicular to the shorter side.

Therefore, the etching can be completed more quickly to form the void 103 by i) leaving the longer side surfaces uncovered or ii) forming the fixing layer 110 such that the coverage of the longer side by the fixing layer 110 is smaller than the coverage of the shorter side by the fixing layer 110. This makes it possible to reduce the risk of the island 108 being damaged by etching in the etching process for removing the region to be removed 106.

It should be noted that the void 103 is formed by removing the layer to be removed 102 by etching in the above description, but the void may be formed by removing the surface region of the base material substrate 101 by anisotropic etching without forming the layer to be removed 102.

If the void is formed by removing the region of the surface of the base material substrate 101 by anisotropic etching, both side surfaces in an orientation having a large etching rate are preferably set to be in the second orientation in the process of forming the fixing layer. Both of these side surfaces in the second orientation may be entirely exposed, or partial regions thereof may be covered by the fixing layer 110. Further, the fixing layer 110 is preferably formed in a manner in which the coverage of both side surfaces of the semiconductor thin film layer 104 in the second orientation by the fixing layer 110 extending in the second orientation is less than the coverage of both side surfaces of the semiconductor thin film layer 104 in the first direction by the fixing layer 110 extending in the first direction. This makes it possible to form the void 103 easily by etching.

In the above description, the semiconductor thin film layer island 108 is rectangular, but the island 108 may be square in the following cases.

1) A case where the semiconductor thin film layer is separated from the base material substrate by removing the layer to be removed 102 by etching 2) A case where the anisotropic etching is used to remove the surface region of the base material substrate 101

3) A case where the island 108 is very small (for example, 20 μm or less)

<A Process of Separating the Semiconductor Thin Film Layer Island 108>

Figure 2A:
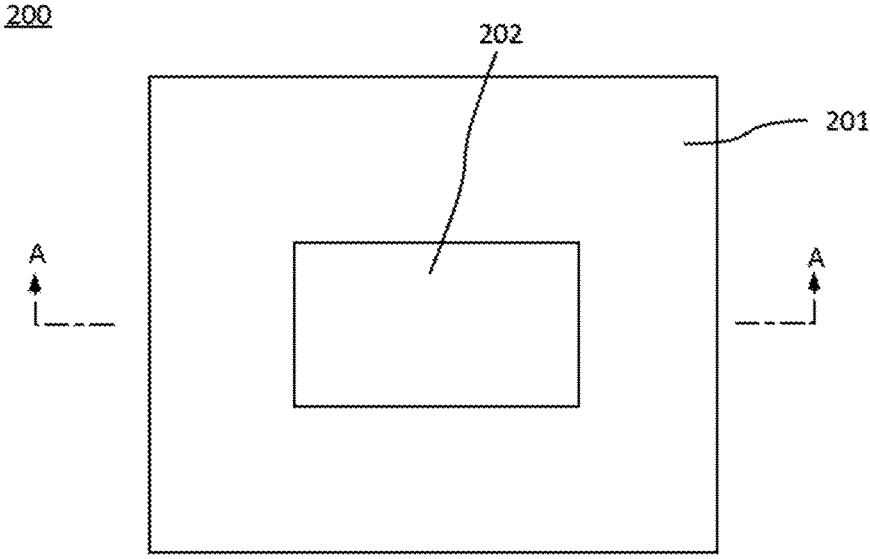
FIG. 2A shows a pick-up substrate which is a third substrate.
Figure 2B:
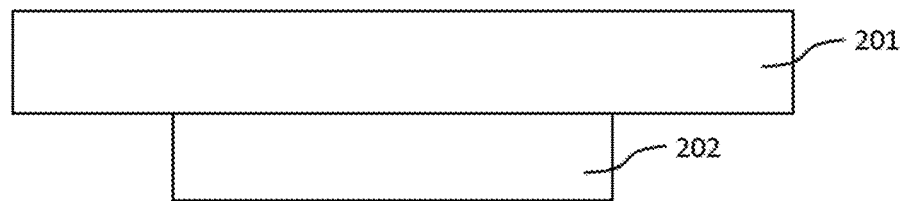
FIG. 2B shows an A-A-line cross section of the pick-up substrate shown in FIG. 2A.

FIG. 2A shows the pick-up substrate 200, which is a third substrate, for separating the semiconductor thin film layer island 108 from the base material substrate 101. FIG. 2B shows an A-A-line cross section of the pick-up substrate shown in FIG. 2A. As shown in FIG. 2B, the pick-up substrate 200 has a base substrate 201 and a pick-up bump 202 made of an organic material formed on the base substrate 201. As the base substrate 201. for example, quartz, sapphire, a transparent substrate such as glass, a semiconductor substrate such as Si, a ceramic substrate, or a metal substrate or the like can be selected. The base substrate 201 may be made of a single material or a laminated material. Further, the base substrate 201 may be a substrate having a surface coated with other materials.

The pick-up hump 202 is, for example, an organic material layer, and can be formed by performing a standard photolithography process on a photosensitive organic material applied onto the base substrate 201. The organic material layer may be formed by applying a coating on a pick-up base substrate using, for example, a spin-coating method, a dip method, or the like, and may be formed by attaching an organic material film on the pick-up base substrate.

The structure of the pick-up substrate can be varied depending on the shape and size of the island 108 to be picked up. For example, the pick-up substrate may have another structure interposed between the base substrate 201 and the pick-up bump 202. Further, the pick-up substrate does not need to have the pick-up bump 202 that matches the shape of the island 108 to be separated from the base material substrate 101, and may have a flat pick-up layer 204 having an area larger than that of the island 108, as in the pick-up substrate 200' shown in FIG. 2C.

Figure 3A:
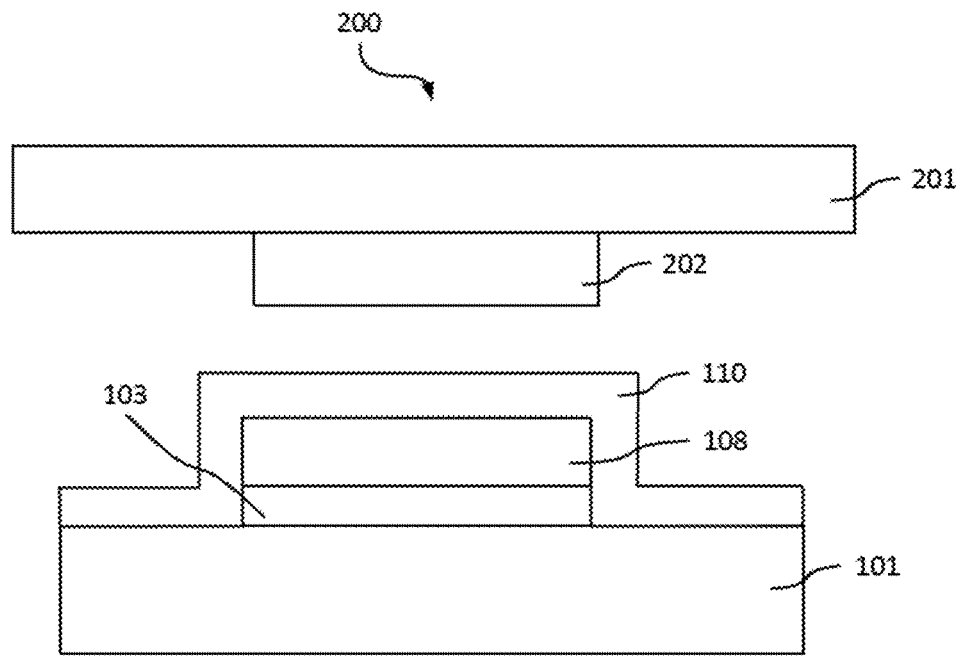
FIG. 3A schematically shows a process of separating the semiconductor thin film layer island from the base material substrate.
Figure 3B:
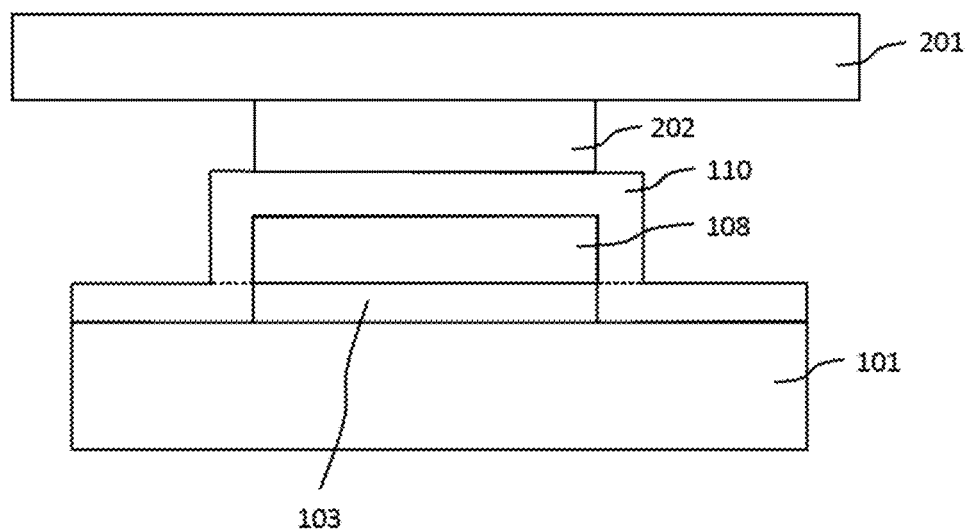
FIG. 3B schematically shows the process of separating the semiconductor thin film layer island from the base material substrate.
Figure 3C:
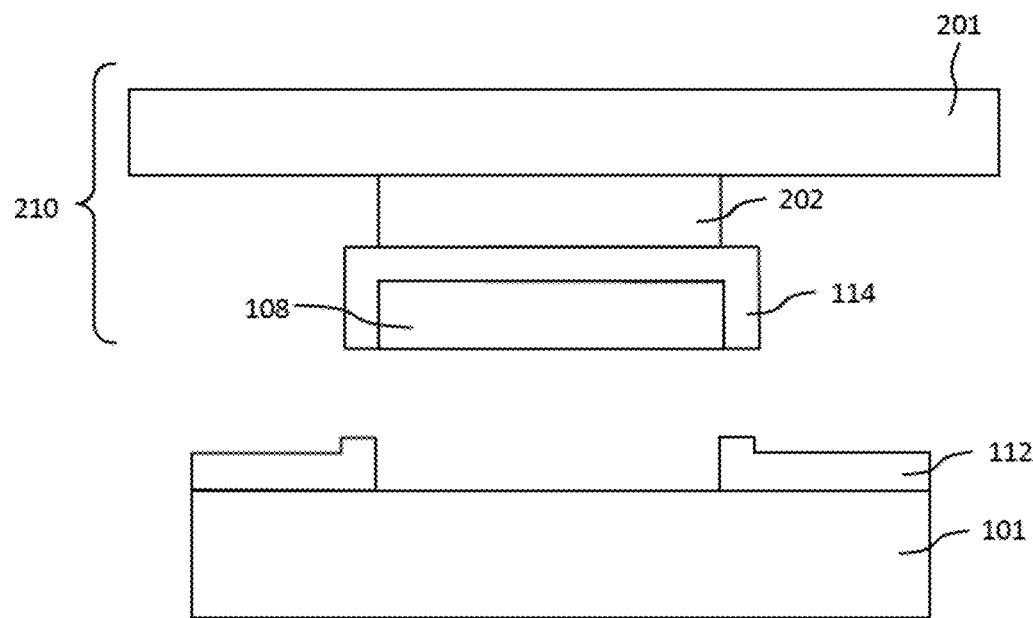
FIG. 3C schematically shows the process of separating the semiconductor thin film layer island from the base material substrate.

FIGS. 3A to 3C schematically show a process of separating the island 108 from the base material substrate 101 by using the pick-up substrate 200.

First, the pick-up bump 202 of the pick-up substrate 200 is aligned with the island 108 as shown in FIG. 3A. Specifically, the pick-up substrate 200 is disposed at a position so that at least a partial region of the pick-up bump 202 overlaps with at least partial regions of the fixing layer 110 and the island 108.

Next, the pick-up bump 202 is brought into contact with or pressed against at least the partial regions of the fixing layer 110 and the island 108 as shown in FIG. 3B. As a result, the pick-up bump 202 is coupled to at least the partial regions of the fixing layer 110 and the island 108. When a downward force is applied to the pick-up substrate 200 contacting the fixing layer 110 and the island 108 while the void 103 is formed between the island 108 and the base material substrate 101, the fixing layer 110 cracks or breaks in the vicinity of a boundary line (a broken line in FIG. 3B) between the island 108 and the void 10.

As shown in FIG. 3C, the pick-up substrate 200 coupled to the partial region of the fixing layer 110 is pulled up in a state where the fixing layer 110 cracks or breaks, thereby breaking the fixing layer 110 into a fixing layer 114 adjoining the island 108 and a fixing layer 112 adjoining the base material substrate 101, and the fixing layer 114, which is the partial regions of the semiconductor thin film layer island 108 and the fixing layer 110, can be separated from the base material substrate 101.

It should be noted that the island 108 may be separated from the base material substrate 101 in a state where the surface of the island 108 facing the base material substrate 101 is accompanied by a semiconductor layer of a material different from the semiconductor thin film layer 104. For example, the island 108 separated from the base material substrate 101 may be accompanied by a mask film or a dielectric layer provided on the base material substrate 101 for selectively growing or laterally growing the semiconductor thin film layer 104.

[A Process of Bonding the Semiconductor Thin Film Layer Island 108 to Another Substrate]

Figure 3D:
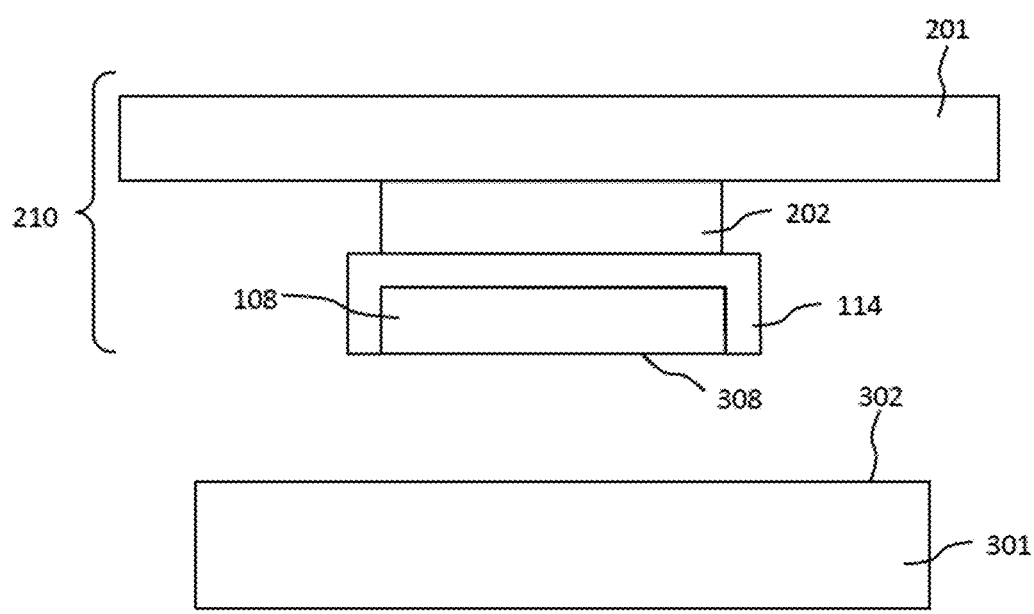
FIG. 3D schematically shows a process of bonding the separated semiconductor thin film layer island to a destination substrate.
Figure 3E:
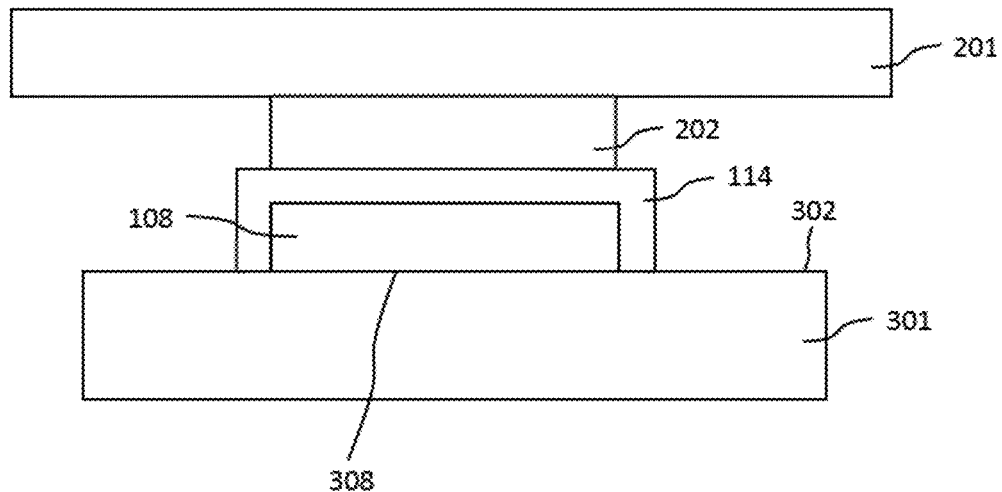
FIG. 3E schematically shows the process of bonding the separated semiconductor thin film layer island to a destination substrate.
Figure 3F:
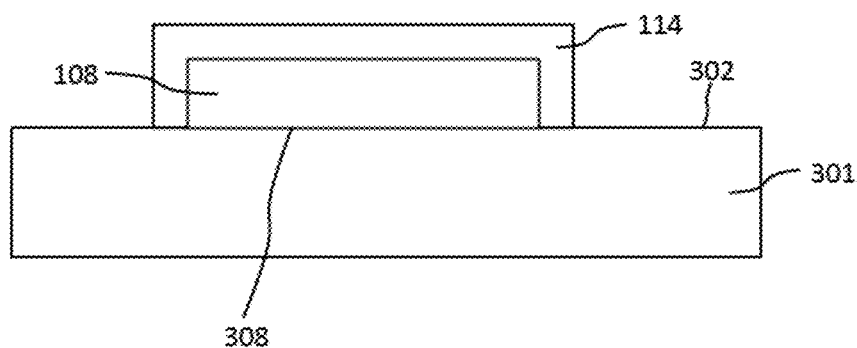
FIG. 3F schematically shows the process of bonding the separated semiconductor thin film layer island to a destination substrate.
Figure 4A:
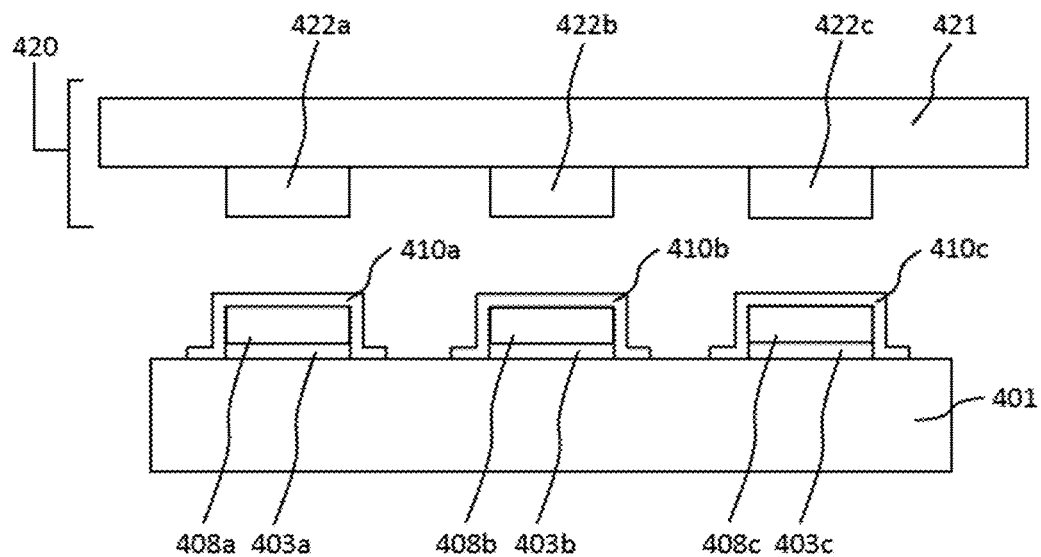
FIG. 4A schematically shows a process of transferring a plurality of semiconductor thin film layer islands.
Figure 4B:
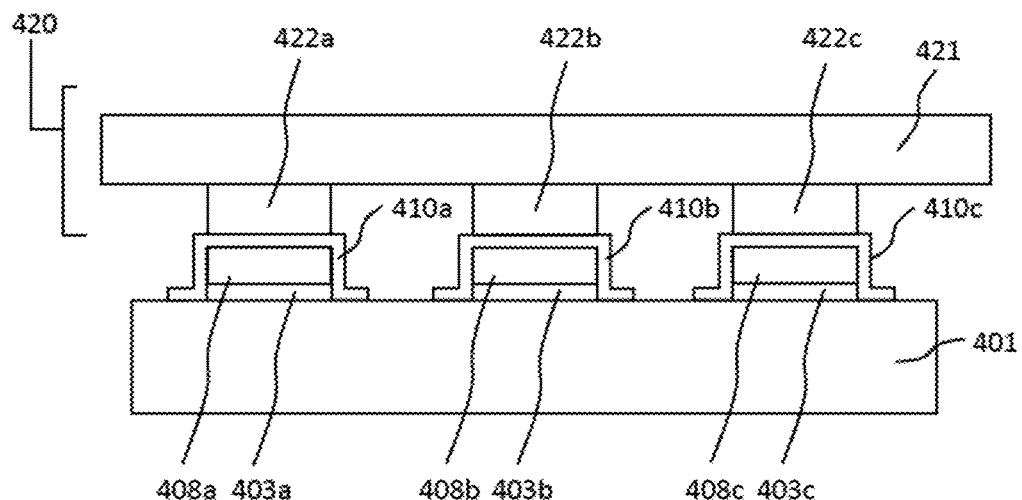
FIG. 4B schematically shows the process of transferring the plurality of semiconductor thin film layer islands.
Figure 4C:
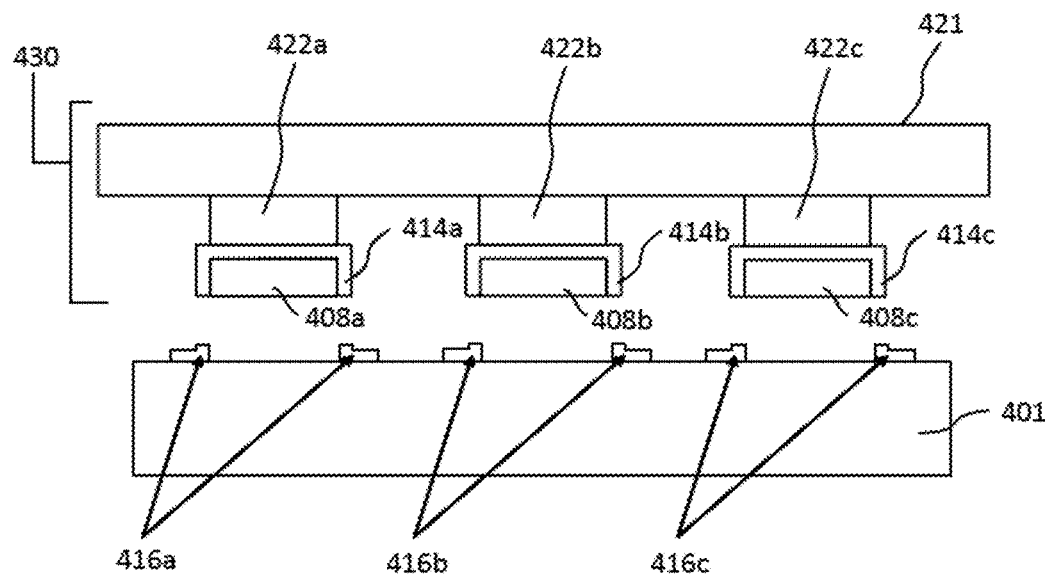
FIG. 4C schematically shows the process of transferring the plurality of semiconductor thin film layer islands.
Figure 4D:
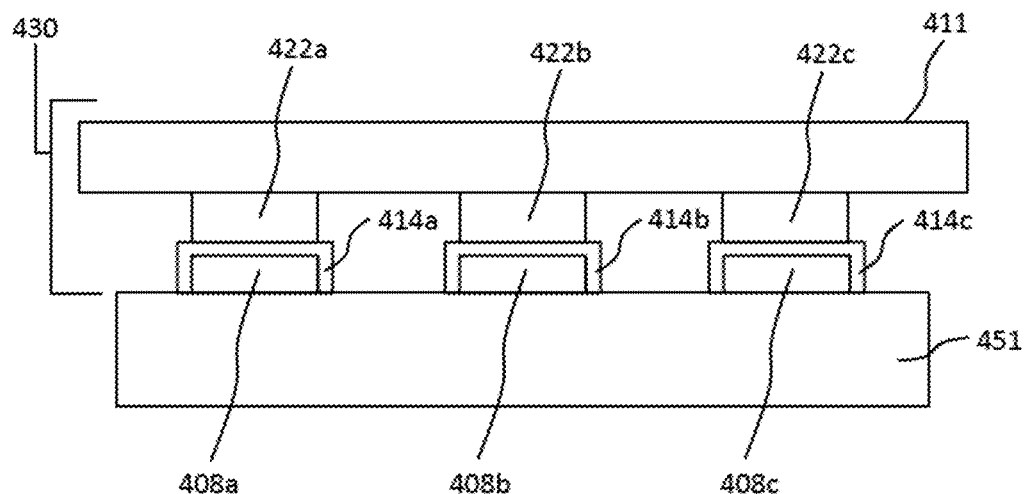
FIG. 4D schematically shows the process of transferring the plurality of semiconductor thin film layer islands.
Figure 4E:
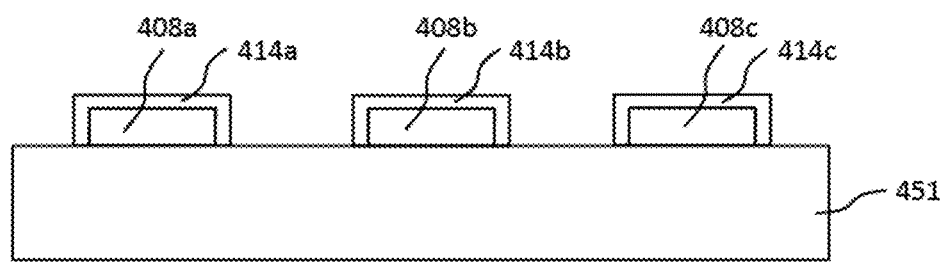
FIG. 4E schematically shows the process of transferring the plurality of semiconductor thin film layer islands.

FIGS. 3D to 3F schematically show a process of bonding the separated semiconductor thin film layer island 108 to a destination substrate 301. As shown in FIG. 3D, a structure 210 with a state in which the island 108 and the fixing layer 114 are coupled to the pick-up substrate 200 is aligned at a predetermined position above the destination substrate 301 which is the second substrate.

Thereafter, a surface 308 of the island 108 positioned below the fixing layer 114 in the structure 210 is pressed against the destination substrate 301 as shown in FIG. 3E, thereby bonding the island 108 to the destination substrate 301. Prior to the process of pressing the island 108 against the destination substrate 301, surfaces to be bonded (a surface 302 of the destination substrate 301 and the surface 308 of the semiconductor thin film layer island 108) may be appropriately surface-treated.

Next, the pick-up bump 202 and the base substrate 201 are removed from the fixing layer 114 as shown in FIG. 3F. For example, the pick-up bump 202 is dissolved by immersing the pick-up bump 202 in a chemical solution such as an organic solvent that dissolves an organic material constituting the pick-up bump 202, thereby separating the fixing layer 114 and the base substrate 201 from each other.

If the connection between the destination substrate 301 and the island 108 becomes strong in a step of pressing the island 108 against the destination substrate 301, the pick-up substrate 200 may be pulled up before the chemical solution such as an organic solvent dissolves the pick-up bump 202. In this case, a step of cleaning the destination substrate 301 to which the island 108 is bonded with the chemical solution such as an organic solvent may be added after pulling up the pick-up substrate 200.

It should be noted that a predetermined device structure or a part of a device structure may be formed on the above-described island 108 bonded to the destination substrate 301 before forming the fixing layer 110.

Further, after bonding the island 108 onto the destination substrate 301 described above, the fixed layer 110 may be processed and an interiayer insulating film may be formed on the semiconductor thin film layer such that a wiring structure for forming an electrical connection with an external structure is formed.

Further, the island 108 is bonded to the surface of the destination substrate 301 in the above description, but other layer (such as an inorganic material thin film layer and an organic material thin film layer) may be provided between the destination substrate 301 and the island 108. In addition, a heat treatment step may be provided after the bonding step.

Further, when bonding the island 108 separated from the base material substrate 101 to the destination substrate 301, the surface of the side of the island 108 to be bonded to the destination substrate 301 may be accompanied by a semiconductor layer made of a material different from that of the semiconductor thin film layer 104. For example, the island 108 accompanied by a mask film or a dielectric layer for selectively growing or laterally growing the semiconductor thin film layer 104 provided on the base material substrate 101 may be bonded to the destination substrate 301.

<A Method for Transferring a Plurality of Islands 108>

The above explanation discloses the method for transferring one single semiconductor thin film layer island 108, but the method for manufacturing the semiconductor device according to the present embodiment also allows transferring a plurality of semiconductor thin film layer islands 408a, 408b, and 408c as shown in FIGS. 4A to 4E. When collectively separating the plurality of islands 408a, 408b, and 408c from a base material substrate 401, a pick-up substrate 420 including a plurality of pick-up bumps 422a, 422b, and 422c corresponding to the plurality of islands 408a, 408b, and 408c is prepared. Then, the pick-up substrate 420 is brought into contact with or pressed against fixing layers 410a, 410b, and 410c and the islands 408a, 408b, and 408c with the same process as described above to separate the plurality of islands 408a, 408b, and 408c from the base material substrate 401, and the plurality of islands 408a, 408b, and 408c are bonded onto a destination substrate 451.

Figure 2C:
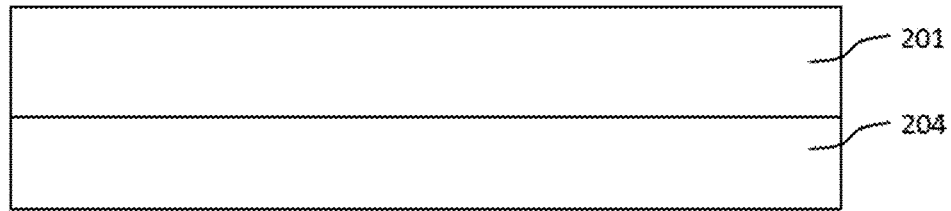
FIG. 2C shows a variation of the pick-up substrate.

FIGS. 4A to 4F schematically show the process of transferring the plurality of islands 408a, 408b, and 408c. In FIGS. 4A to 4E, the base material substrate 401, a plurality of voids 403a, 403b, and 403c, the plurality of islands 408a, 408b, and 408c, the plurality of fixing layers 410a, 410b, and 410c, a plurality of fixing layers 414a, 414b, and 414c, a plurality of fixing layers 416a, 416b, and 416c, the pick-up substrate 420, a base substrate 421, the plurality of pick-up bumps 422a, 422b, and 422c, a structure 430, and the destination substrate 451 respectively correspond to the base material substrate 101, the void 103, the island 108, the fixing layer 110, the fixing layer 112, the fixing layer 114, the pick-up substrate 200, the base substrate 201, the pick-up bump 202, the structure 210, and the destination substrate 301 in FIGS. 3A to 3F. A pick-up substrate, as shown in FIG. 2C, that does not have a pick-up bump but includes a pick-up layer made of an organic material may be used when separating the plurality of islands 408a, 408b, and 408c from the base material substrate 401.

[Transfer of the Plurality of Semiconductor Thin Film Layer Islands]

FIGS. 5A to 5E are figures for explaining a method for transferring the plurality of semiconductor thin film layer islands. In FIGS. 5A to 5E, a base material substrate 501, a plurality of voids 503a, 503b, and 503c, a plurality of islands 508a, 508b, and 508c, a plurality of fixing layers 510a, 510b, and 510c, a plurality of fixing layers 514a and 514c, a plurality of fixing layers 516a and 516c, a pick-up substrate 520, a base substrate 521, a plurality of pick-up bumps 522a and 522c, a structure 530, a destination substrate 531, and a surface 551 respectively correspond to the base material substrate 101, the void 103, the island 108, the fixing layer 110, the fixing layer 114, the fixing layer 112, the pick-up substrate 200, the base substrate 201, the pick-up bump 202, the structure 210, the destination substrate 301, and the surface 302 in FIGS. 3A to 3F. Hereinafter, a method for selecting and transferring some of the islands to the destination substrate out of the plurality semiconductor thin film layer islands formed on the base material substrate will be described.

Figure 5A:
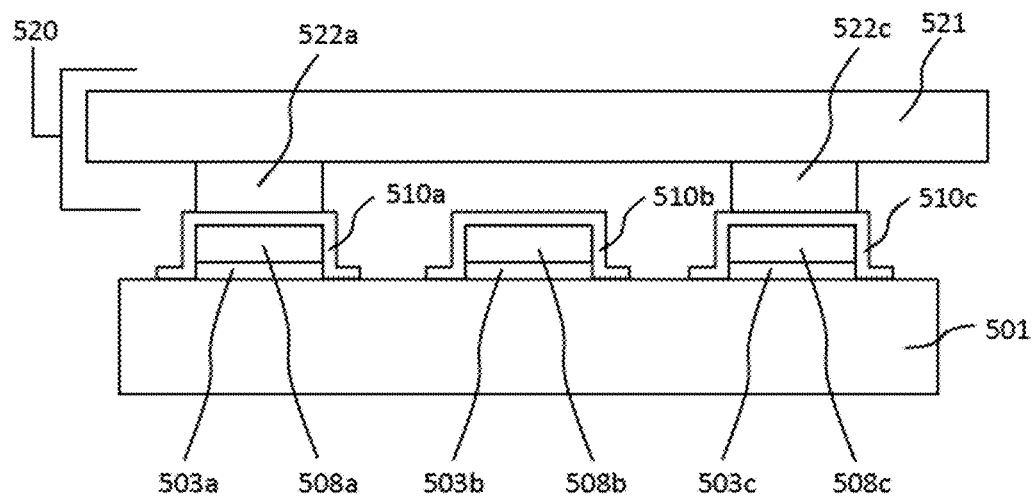
FIG. 5A is a figure for explaining a method for transferring the plurality of semiconductor thin film layer islands.
Figure 5B:
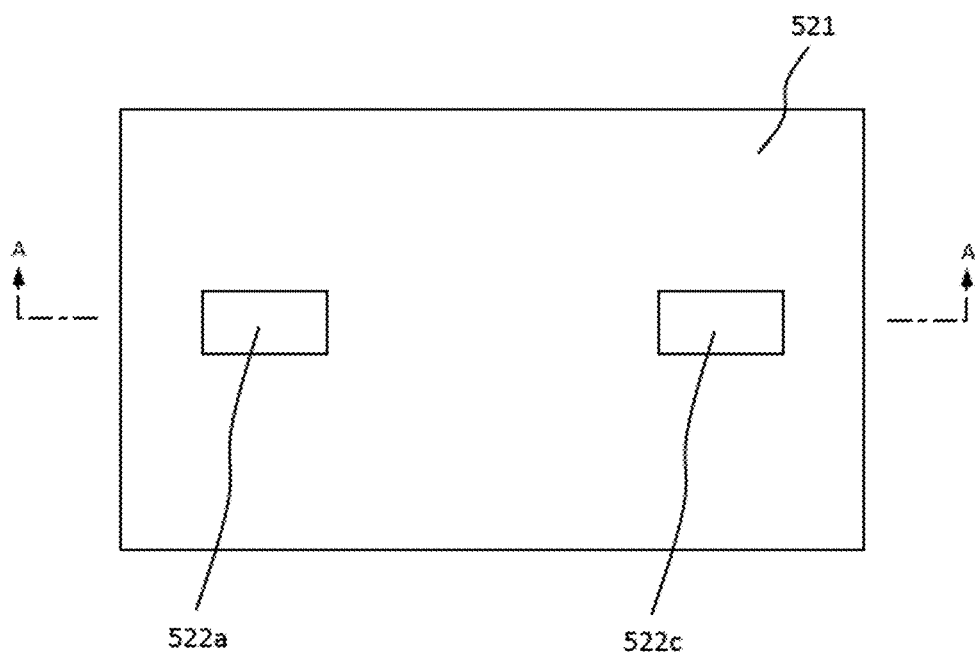
FIG. 5B is a figure for explaining the method for transferring the plurality of semiconductor thin film layer islands.

As shown in FIG. 5A, after the voids 503a to 503c are formed at least directly below the semiconductor thin film layer islands, the pick-up bumps 522a and 522c made of an organic material are provided on the base substrate 521 of the pick-up substrate 520 only at positions corresponding to the selected semiconductor thin film layer islands 508a and 508c. Subsequently, the pick-up bumps 522a and 522c are brought into contact with or pressed against the islands 508a and 508c, and the pick-up substrate 520 is coupled to the selected islands 508a and 508c. FIG. 5B is an overhead view of FIG. 5A, and FIG. 5A is the A-A-line cross section of FIG. 5B.

Figure 5C:
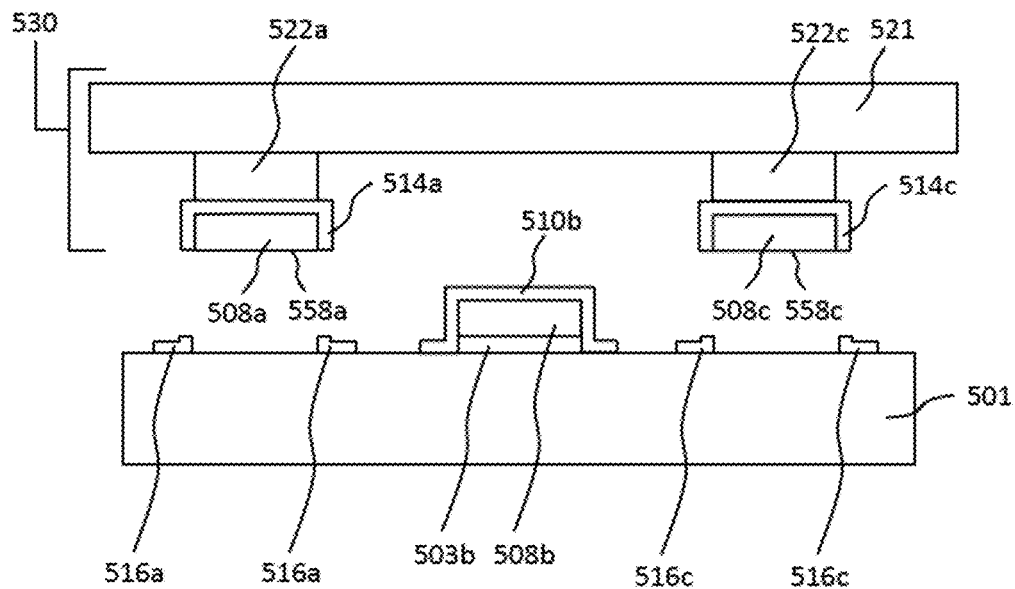
FIG. 5C is a figure for explaining the method for transferring the plurality of semiconductor thin film layer islands.

Next, the pick-up substrate 520 coupling the selected islands 508a and 508c is pulled up, and only the selected islands 508a and 508c are separated from the base substrate 501, as shown in FIG. 5C. FIG. 5C shows the pick-up substrate 520 lifting the selected islands 508a and 508c. A non-selected island 508b remains on the base material substrate 501 as shown in FIG. 5C.

Figure 5D:
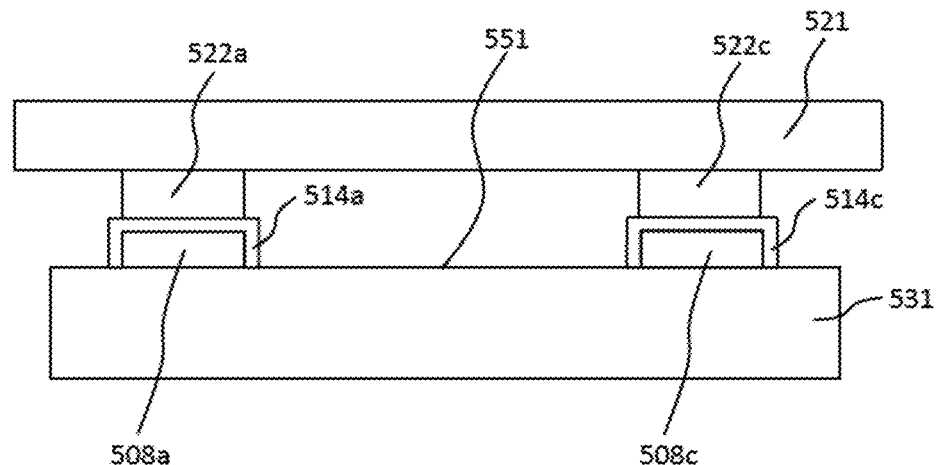
FIG. 5D is a figure for explaining the method for transferring the plurality of semiconductor thin film layer islands.

Next, a structure (the structure 530 shown in FIG. 5C), in which the pick-up substrate 520 with the island 508a, the island 508c, the fixing layer 514a, and the fixing layer 514c are coupled, is disposed at a predetermined position on the destination substrate 531 as shown in FIG. 5D. Subsequently, a surface 558a and a surface 558c of the island 508a and the island 508c, on the side opposite to the fixing layer 514a and the fixing layer 514c, are pressed against the surface 551 of the destination substrate 531, and the selected islands 508a and 508c are bonded to the destination substrate 531.

Figure 5E:
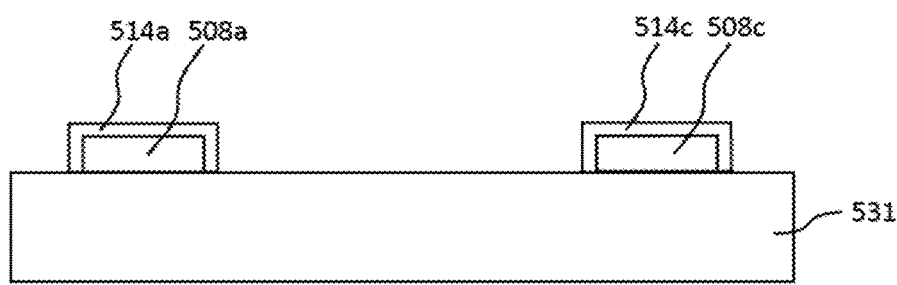
FIG. 5E is a figure for explaining the method for transferring the plurality of semiconductor thin film layer islands.

Next, the pick-up bump 522a, the pick-up bump 522c, and the base substrate 521 are removed from the destination substrate 531, thereby manufacturing a semiconductor device, in which the semiconductor thin film layer islands 508a and 508c are bonded to the destination substrate 531, as shown in FIG. 5E.

[A Process Flow of the Method for Manufacturing the Semiconductor Device]

Figure 6:
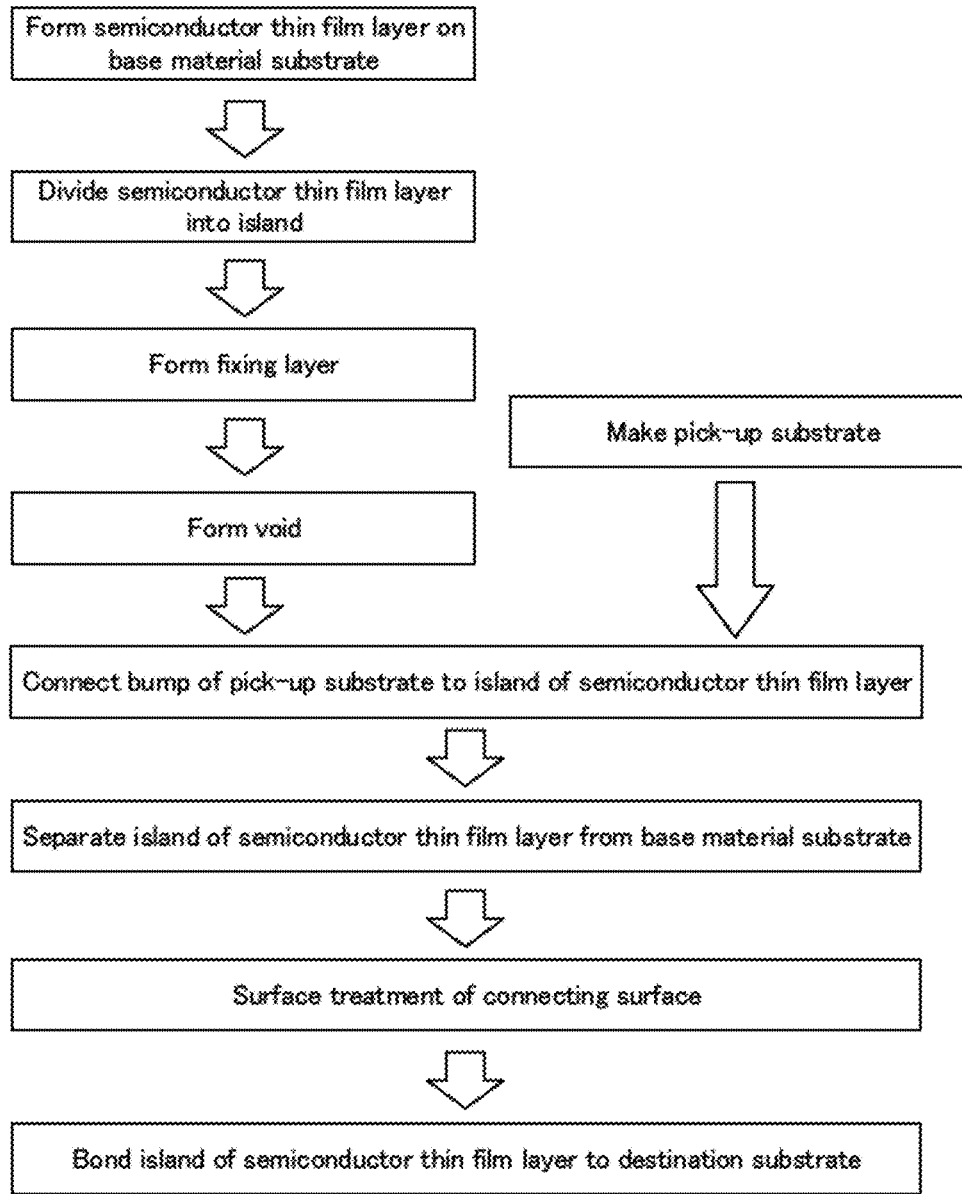
FIG. 6 shows a process flow of a method for manufacturing a semiconductor device according to the present embodiment.

FIG. 6 shows a process flow of the method for manufacturing the semiconductor device according to the present embodiment. As shown in FIG. 6, in the method of manufacturing the semiconductor device according to the present embodiment, the selected islands 508a and 508c may be separated from the base material substrate 501 and bonded to the destination substrate 531 by using the pick-up substrate 520 having the pick-up bumps 522a and 522c made of an organic material corresponding to the predetermined selected semiconductor thin film layer islands 508a and 508c on the base material substrate 501. This makes it possible to select desired islands 508a and 508c out of the plurality of islands 508a, 508b, and 508c on the base material substrate 501 and to bond the selected islands 508a and 508c to the destination substrate 531.

It is obvious that various modifications can be made to the method for separating the desired islands 508a and 508c out of the plurality of islands 508a, 508b, and 508c on the base substrate 501.

[Effects of the Method for Manufacturing the Semiconductor Device of the Present Embodiment]

According to the method for manufacturing the semiconductor device described above, the semiconductor thin film layer island 108 fixed on the base material substrate 101 by the fixing layer 110 is separated from the base material substrate 101 by using the pick-up substrate 200 with the pick-up bump 202 made of an organic material formed on the base substrate 201 by photolithography, and the semiconductor thin film layer island 108 coupled to the pick-up substrate 200 is bonded to the destination substrate 301 by pressure. This enables the semiconductor thin film layer 104 separated from the base material substrate 101 to be easily transferred to another substrate.

Further, it is also apparent to those skilled in the art that the pick-up substrate 200 including the pick-up bump 202 having the optimum shape and size can be easily produced to match the semiconductor thin film layer island 108 to be separated from the base material substrate 101. According to the method for manufacturing the semiconductor device of the present embodiment, the pick-up substrate 200, which can be easily produced, separates the semiconductor thin film layer island 108 from the base material substrate 101 and bonds the island 108 to the destination substrate 301, and so the semiconductor thin film layer island 108 can be transferred at a low cost.

Further, the base substrate 201 can be repeatedly used since the pick-up bump 202 made of an organic material and the base substrate 201 of the pick-up substrate 200 are removed from the destination substrate 301 after the semiconductor thin film layer island 108 is bonded to the destination substrate 301.

Furthermore, forming the fixing layer 110 extending in the longitudinal orientation of the island 108 as described above produces the following effects.

(1) A device structure, such as wiring and an electrode formed on the semiconductor thin film layer surface and the semiconductor thin film layer island 108, can be protected in case an etchant or etching gas is used in the process of forming the void between the semiconductor thin film layer island 108 and the base material substrate 101.

(2) The amount of warpage of the semiconductor thin film layer island 108 due to stress applied to the semiconductor thin film layer island 108 can be reduced in the process from forming the void between the semiconductor thin film layer island 108 and the base material substrate 101 to bonding the island 108 on the destination substrate 301. If the warpage of the semiconductor thin film layer island 108 is reduced by reducing the stress as described above, for example, the fixing layer 110 easily retains the semiconductor thin film layer island 108 above the base material substrate 101 in a slate where the void is formed. As a result, it is easy to separate the semiconductor thin film layer island 108 by using the pick-up substrate 200 as well as to retain the semiconductor thin film layer island 108 on the destination substrate 301 in the bonding process onto the destination substrate 301.

(3) The fixing layer 110 can be used as an interlayer insulating film or the like between a wiring layer and the semiconductor thin film layer in a device forming process after bonding the island 108 onto the destination substrate 301.

(4) A disconnection of the wiring layer can be prevented at a level difference portion that exists if the fixing layer 110 is discontinuous when forming the wiring layer on the fixing layer 110 in the device forming process after bonding the island 108 onto the destination substrate 301.

(5) It is easy to ensure uniformity of the characteristics of the semiconductor device formed by using the semiconductor thin film layer island 108 bonded onto the destination substrate 301. Because the surface of the semiconductor thin film layer island 108 is coated by a continuous fixing layer 110, for example, the intensity distribution of light emitted from the upper surface of the light emitting device becomes uniform. If the surface of the semiconductor thin film layer island 108 is covered by a discontinuous fixing layer 110, the light intensity changes in a discontinuous region of the fixing layer 110.

It should be noted that the semiconductor thin film layer has a rectangular shape in the above description, but the semiconductor thin film layer may have a circular shape or a complicated shape other than the rectangular shape. Further, although a simple semiconductor thin film layer having no device structure is exemplified (illustrated) in the above description, the semiconductor thin film layer may have a device structure. Furthermore, the semiconductor thin film layer surface does not have to be flat, and may be provided with a thin film structure of a dielectric material or a metal material corresponding to a device structure.

[A Variation of the Method for Manufacturing the Semiconductor Device]

Figure 7A:
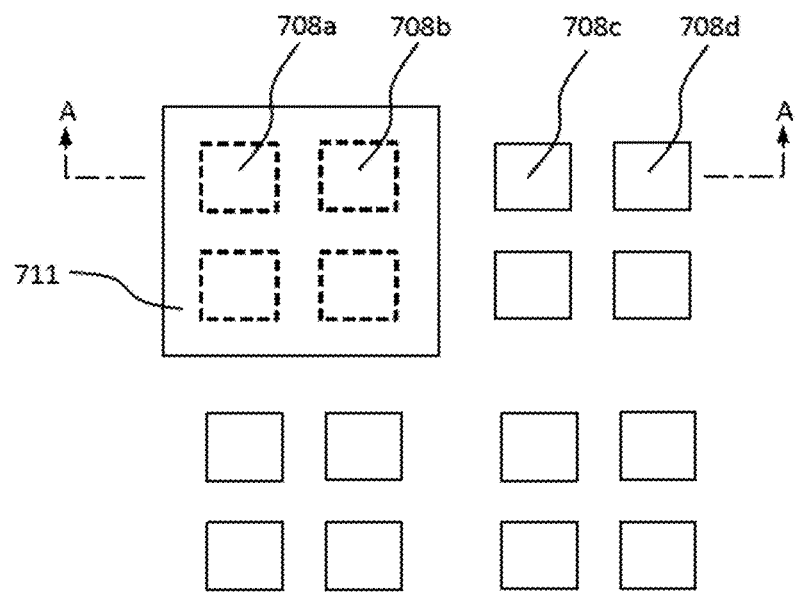
FIG. 7A is an example of a variation of the method for manufacturing the semiconductor device.
Figure 7B:
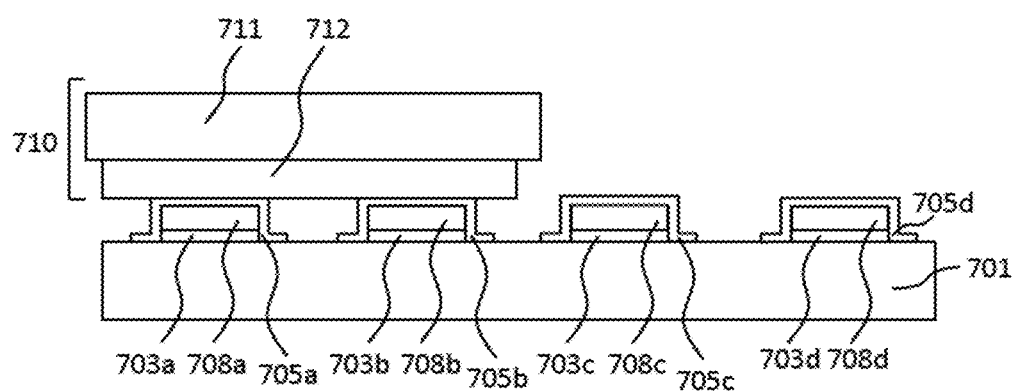
FIG. 7B is the example of the variation of the method for manufacturing the semiconductor device.
Figure 7C:
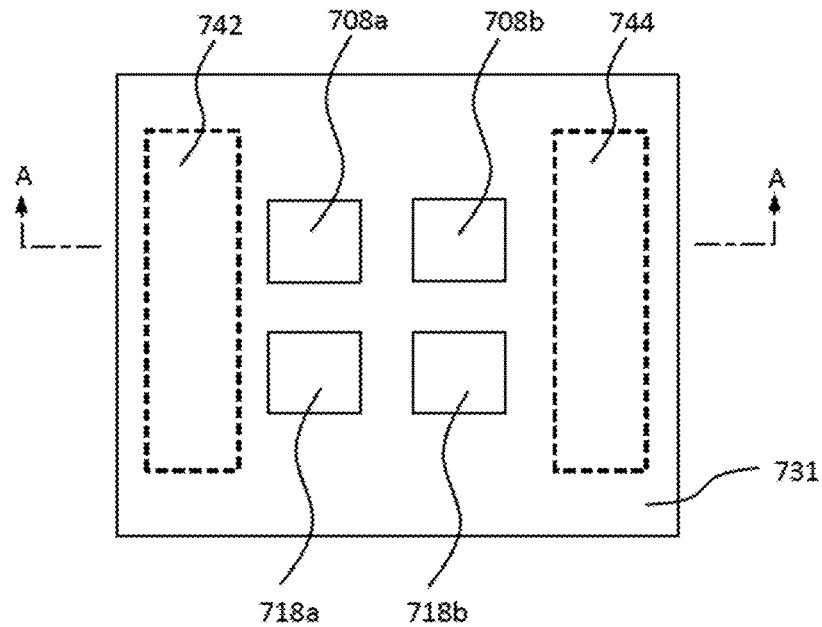
FIG. 7C is the example of the variation of the method for manufacturing the semiconductor device.
Figure 7D:
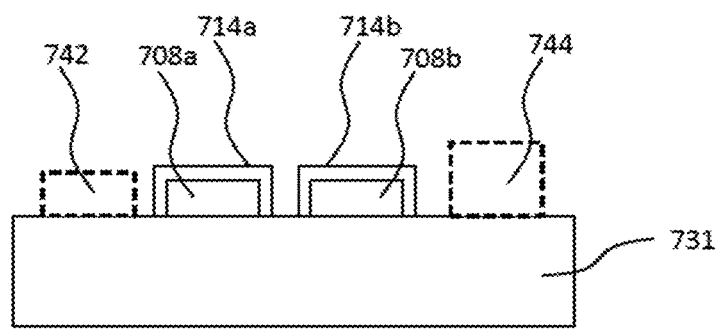
FIG. 7D shows an A-A-line cross section of the semiconductor device.

FIGS. 7A to 7D show an example of a variation of the method for manufacturing the semiconductor device. In FIGS. 7A to 7D, a base material substrate 701, a plurality of voids 703a, 703b, 703c, and 703d, a plurality of islands 708a, 708b, 708c, 708d, 718a, and 718b, a plurality of fixing layers 705a, 705b, 705c, and 705d, a plurality of fixing layers 714a and 714b, a pick-up substrate 710, a base substrate 711, a pick-up layer 712, and a destination substrate 731 respectively correspond to the base material substrate 101, the void 103, the island 108, the fixing layer 110, the fixing layer 114, the pick-up substrate 200, the base substrate 201, the pick-up layer 204, and the destination substrate 301 in FIG. 2C and FIGS. 3A to 3F. As shown in FIGS. 7A and 7B (FIG. 7B is an A-A-line cross section of FIG. 7A), a plurality of predetermined islands out of the plurality of semiconductor thin film layer islands (for example, the islands 708a, 708b, 708c, 708d, 718a, and 718b) on the base material substrate 701 can be separated from the base material substrate. Further, as shown in FIGS. 7C and 7D (FIG. 7D is an A-A-line cross section of FIG. 7C), the islands (708a, 708b, 718a, and 718b in FIG. 7C) separated from the base material substrate 701 can be well bonded to predetermined positions on the destination substrate 731 on which other devices have been mounted in partial regions (device mounting regions 742 and 744 in FIG. 7C).

[A Process for Manufacturing a Composite Material Device]

Figure 8A:
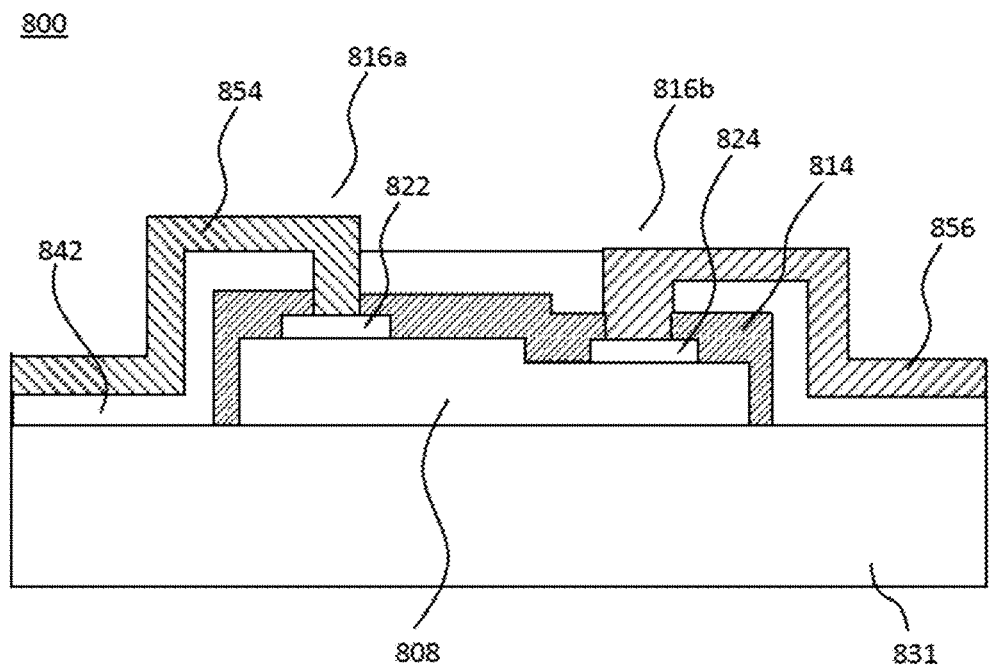
FIG. 8A shows a structure of the semiconductor device.
Figure 8B:
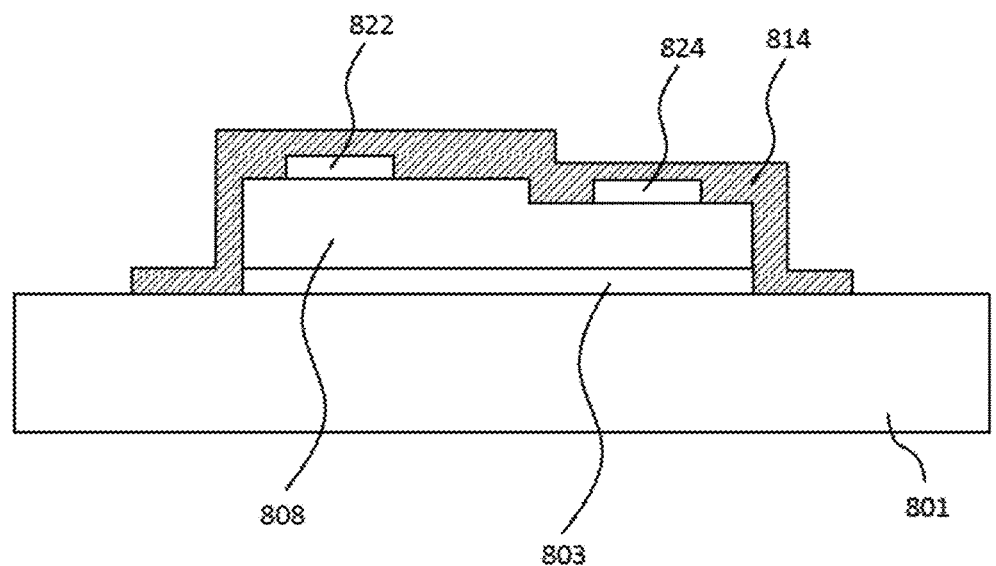
FIG. 8B shows the structure of the semiconductor device.
Figure 8C:
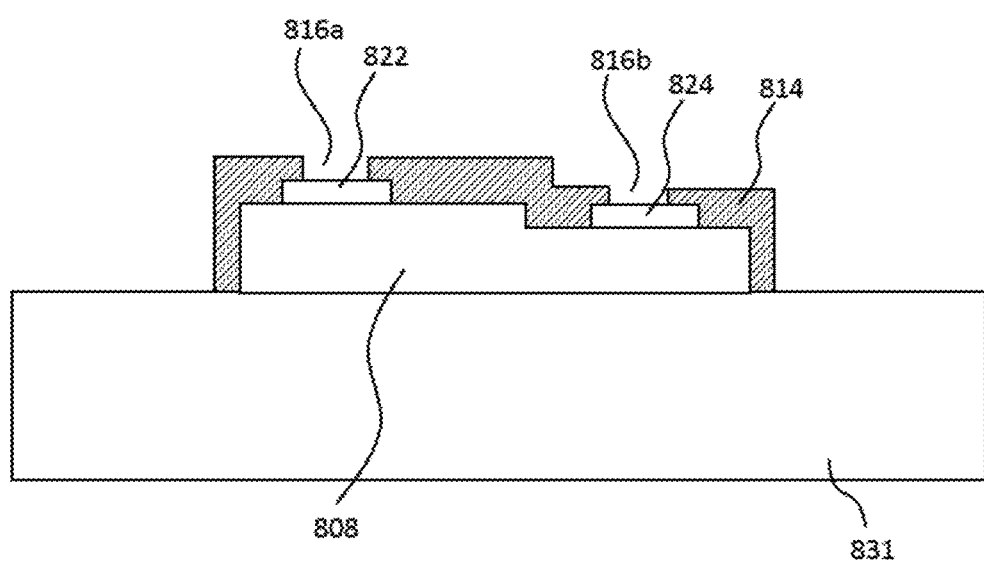
FIG. 8C shows the structure of the semiconductor device.

FIGS. 8A to 8C show a structure of a semiconductor device 800 manufactured using the method for manufacturing the semiconductor device described above. The semiconductor device 800 is a composite material device manufactured by the above-described method for manufacturing. The semiconductor device 800) is manufactured by separating a semiconductor thin film layer island 808 forming a device structure on a base material substrate from a base material substrate 801, bonding it to a destination substrate 831, and forming a wiring connected to the outside the semiconductor thin film layer. The example illustrated here is an example and can be applied to semiconductor devices of various types, materials, and structures.

FIG. 8A shows a cross-section of the semiconductor device 800. In FIG. 8A, the semiconductor thin film layer island 808, electrodes 822 and 824 formed on the island 808, a fixing layer 814 having openings (816a and 816b) at the electrode positions, an interlayer insulating film 842, a wiring layer 854, and a wiring layer 856 are shown.

A device structure is formed by forming the electrodes 822 and 824, or dividing the semiconductor thin film layer into the semiconductor thin film layer island 808 (element separation) after forming the semiconductor thin film layer on the base material substrate to form a predetermined device when manufacturing the semiconductor device 800. Thereafter, the fixing layer 814 is formed as shown in FIG. 8B. Further, a void 803 is formed at least between the base material substrate 801 and the island 808. The void 803 is formed by etching away a region to be removed.

Then, the island 808 is separated from the base material substrate 801 after the pick-up substrate having the pick-up bump or the pick-up layer made of an organic material is coupled to partial regions of the island 808 and the fixing layer 814. Thereafter, the separated island 808 is bonded to a predetermined position on the destination substrate 831. The destination substrate 831 may be made of a material different from the base material substrate 801 and the island 808, for example. Surfaces to be bonded (a bonding surface of the island and a surface of the destination substrate) can be surface-treated for bonding prior to the bonding, if it is required. Another thin film layer, which is not shown in drawings, may be provided between the destination substrate 831 and the island 808.

After bonding the island 808 to the destination substrate 831, openings are formed at the positions of the electrode 822 and the electrode 824 on the island 808 in the fixing layer 814 that is used as an interlayer insulating film, as shown in FIG. 8C. Thereafter, the interlayer insulating film 842 for forming a wiring is formed, and the wiring layer 854 and the wiring layer 856 are formed to respectively couple with the electrode 822 and the electrode 824, as shown in FIG. 8A. In this way, manufacturing of the semiconductor device 800, in which the fixing layer 814 extends on the upper surface of the island 808 and the side surfaces of the island 808 on both sides in the first orientation, is completed.

As described above, according to the method for manufacturing the semiconductor device of the present embodiment, the semiconductor thin film layer island having a device formed on the base material substrate can be favorably separated from the base material substrate and well bonded to the destination substrate, thereby making it possible to obtain a composite material device having high performance and high reliability. The above method for manufacturing can be applied to various sizes and structures of the semiconductor thin film layer included in the semiconductor device. Since the pick-up bump made of an organic material comprised of the pick-up substrate is manufactured by, for example, standard photolithography, an optimal pick-up substrate can be easily prepared according to various changes in the form of the device structure and the semiconductor thin film layer and various changes in the form of the destination substrate. As described above, the method for manufacturing the semiconductor device according to the present embodiment easily enables optimal separation of the semiconductor thin film layer from the base material substrate and optimal bonding of the semiconductor thin film layer onto the destination substrate.

[A Variation of the Shape of the Fixing Layer 110]

FIGS. 9A to 9D show variations of a shape of the fixing layer 110.

Figure 9A:
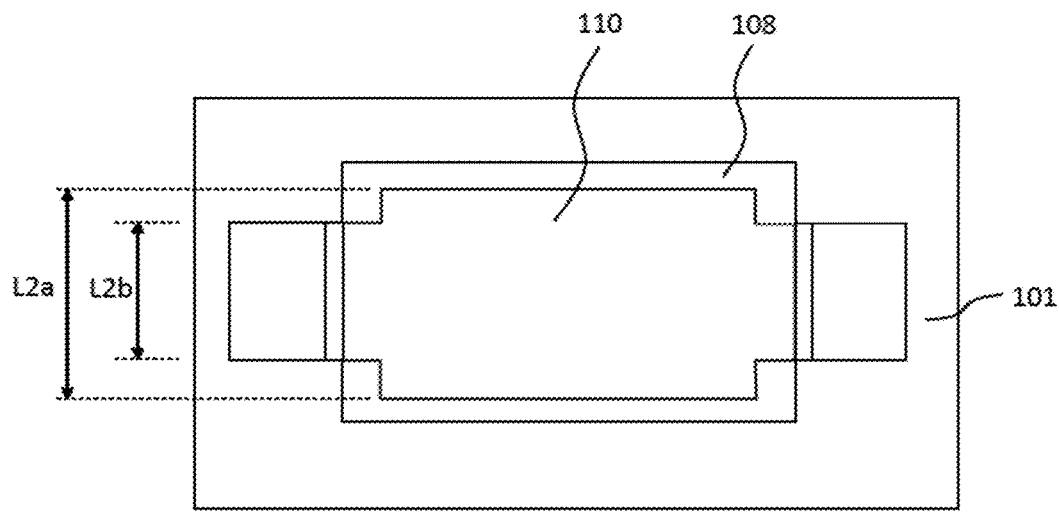
FIG. 9A shows a variation of a shape of a fixing layer.

As shown in FIG. 9A, a width L2b of the fixing layer 110 provided on the base material substrate 101 and the width L2b of the fixing layer 110 covering the side surfaces of the semiconductor thin film layer island 108 may be narrower than a width L2a of a fixing layer covering the upper surface of the island 108. This enables easy separation of the fixing layer 110 provided on the island 108 from the fixing layer 110 provided on the base material substrate 101 when detaching the island 108 from the base material substrate 101 by using the pick-up substrate 200.

Figure 9B:
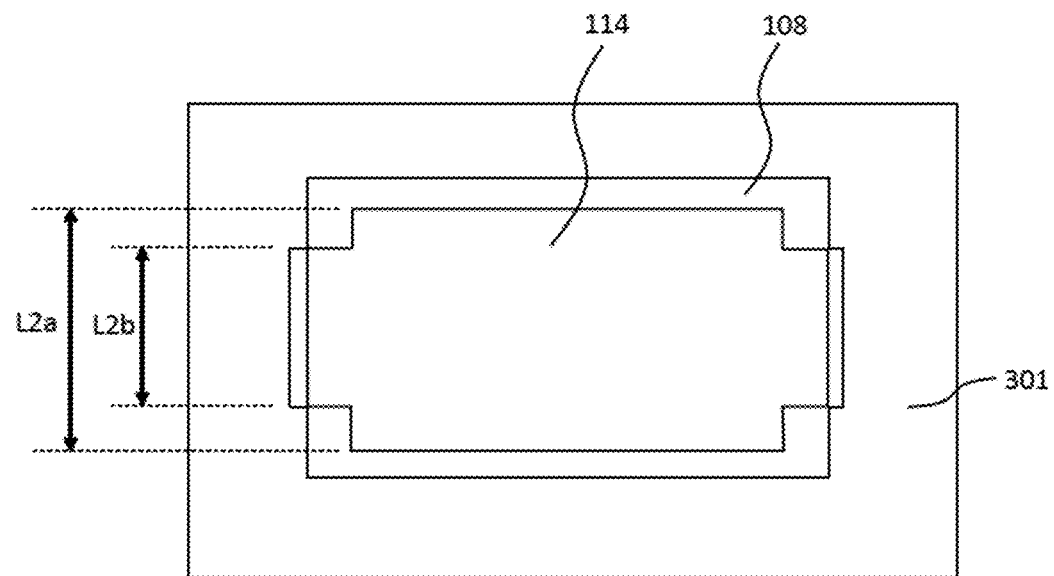
FIG. 9B shows a variation of the shape of the fixing layer.

In this case, as shown in FIG. 9B, the width L2b of the fixing layer 114 covering the shorter side surfaces of the semiconductor thin film layer island 108 is still narrower than the width L2a of the fixing layer 114 covering the upper surface in the composite material device bonded to the destination substrate 301.

Figure 9C:
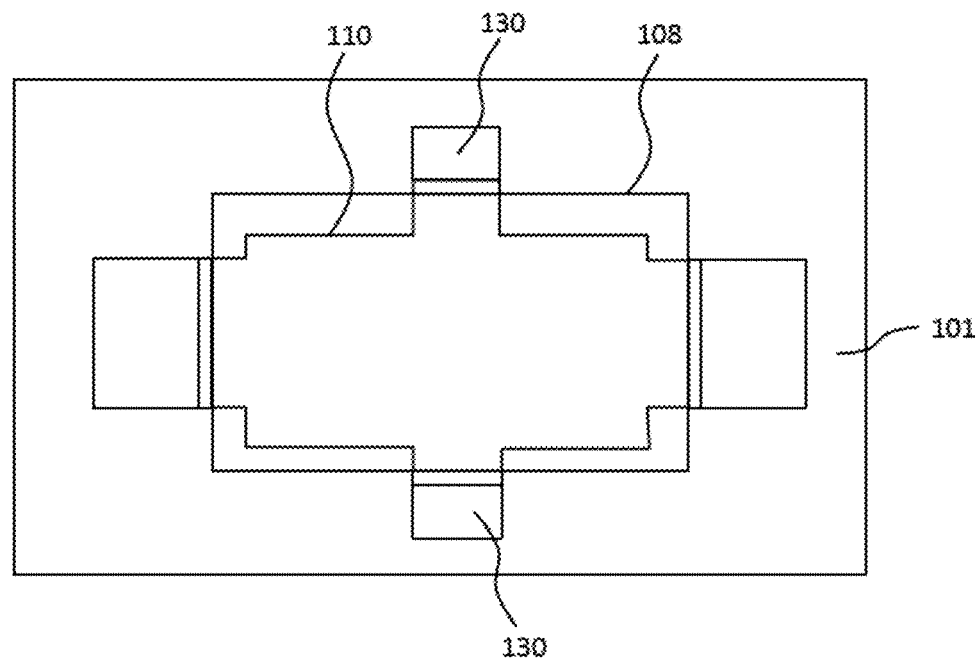
FIG. 9C shows a variation of the shape of the fixing layer.
Figure 9D:
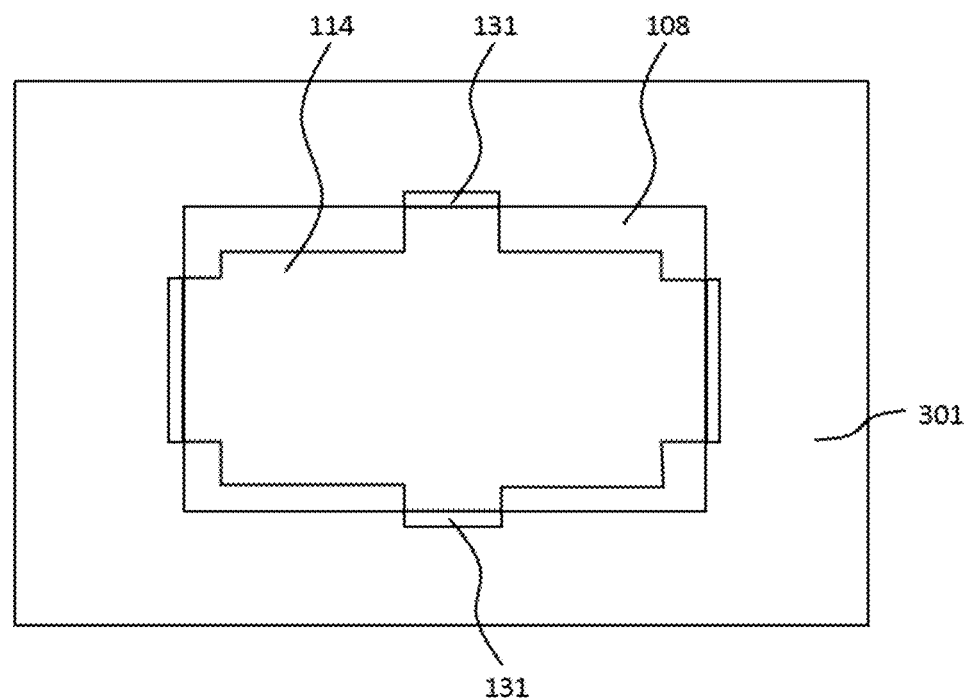
FIG. 9D shows a variation of the shape of the fixing layer.

Further, as shown in FIG. 9C, regions 130 that cover portions of the longer side surfaces of the semiconductor thin film layer island 108 and extend to the base material substrate 101 may be provided in the longer side regions of the fixing layer 110 that covers the semiconductor thin film layer island 108. At this time, the coverage of the longer side surfaces by the fixing layer 110 is preferably smaller than the coverage of the shorter side surfaces by the fixing layer 110. In this case, the regions 131 of the fixing layer 110 covering portions of the longer side surfaces of the semiconductor thin film layer island 108 are formed as shown in FIG. 9D in the destination substrate 301 to which the semiconductor thin film layer island 108 is bonded. The coverage of the longer side surfaces by the fixing layer 110 is smaller than the coverage of the shorter side surfaces by the fixing layer 110 in this state.

[A Reduction of Lattice Defects in the Semiconductor Thin Film Layer 104]

In the process of forming a GaN epitaxial layer on a Si wafer, a crystal defect is sometimes introduced into the semiconductor thin film layer 104 due to i) a lattice mismatch between the material of the base material substrate 101 and the material of the semiconductor thin film layer and ii) a thermal expansion coefficient mismatch (difference in thermal expansion coefficients) between the material of the base material substrate 101 and the material of the semiconductor thin film layer.

A material having the same system as that of the semiconductor thin film layer may be used as the material of the base material substrate 101 to solve such a problem. In this case, it becomes difficult to separate the semiconductor thin film layer from the base material substrate 101 by etching, and therefore a semiconductor wafer, in which a different material layer having a large difference in etching rate with respect to the materials of the base material substrate 101 and the semiconductor thin film layer 104 is provided between the base material substrate 101 and the semiconductor thin film layer 104, can be used as the first substrate. Further, a semiconductor wafer, in which a different material layer constituted by different materials having lattice constants and thermal expansion coefficients different from those of the base material substrate 101 and the semiconductor thin film layer 104 is provided between the base material substrate 101 and the semiconductor thin film layer 104, may be used as the first substrate. For example, Si can be used as a material of the different material layer. In this case, the upper limit of the thickness of the different material layer provided between the base material substrate 101 and the semiconductor thin film layer 104 is preferably equivalent to the thickness of the semiconductor thin film layer 104.

The difference of the lattice constant between the base material substrate 101 and the semiconductor thin film layer 104 is smaller than the difference of the lattice constant between the semiconductor thin film layer 104 and the different material layer, for example. Further, the difference of the thermal expansion coefficient between the base material substrate 101 and the semiconductor thin film layer 104 is smaller than the difference of the thermal expansion coefficient between the semiconductor thin film layer 104 and the different material layer, for example.

If (1) the base material substrate 101 is, for example, a GaN substrate, (2) the different material layer is formed of, for example, Si(111), and (3) the semiconductor thin film layer 104 is formed of, for example, GaN, a downward warping stress (a stress causing the base material substrate 101 to be bent to in a manner to protrude upward) may be generated in the base material substrate 101, and an upward warping stress (a stress causing the semiconductor thin film layer 104 to be bent in a manner to protrude downward) may bo generated, contrary to the base material substrate 101, in the semiconductor thin film layer 104 because the thermal expansion coefficient of GaN, which is 2.59 ppm, is smaller than the thermal expansion coefficient of Si(111), which is 5.59 ppm. As described above, the stresses in opposite directions are generated in the base material substrate 101 and the semiconductor thin film layer 104, and so the base material substrate 101 and the semiconductor thin film layer 104 can be made more resistant to warping.

Further, the upper limit of the thickness of the different material layer provided between the base material substrate 101 and the semiconductor thin film layer 104 is preferably equivalent to the thickness of the semiconductor thin film layer 104. This enables the influence of the base material substrate 101 having a small thermal expansion coefficient difference relative to the semiconductor thin film layer 104 to be dominant in the influence of a thermal stress of a substrate (a laminated structure of the base material substrate 101 and the thin different material layer) with respect to the semiconductor thin film layer 104 even if the thermal expansion coefficient of the different material layer provided between the base material substrate 101 and the semiconductor thin film layer 104 is different from the thermal expansion coefficient of the semiconductor thin film layer 104. Therefore, the influence of the thermal stress on the semiconductor thin film layer 104 of the different material layer can be suppressed to be small. As a result, the lattice defects in the semiconductor thin film layer 104 can be reduced.

Furthermore, the etching rate of the different material layer for a predetermined etching method is greater than the etching rates of the base material substrate 101 and the semiconductor thin film layer 104 for the predetermined etching method. This makes it possible to form the void 103 efficiently by forming the region to be removed 106 of the different material layer shown in FIG. 1C in addition to forming the semiconductor thin film layer 104 with fewer lattice defects described above.

[A Variation of the Material of the Destination Substrate 301]

If a chip size of the semiconductor device is large, there is a problem that heat distribution is generated in a chip according to the thermal conductivity of a substrate material which is a base of a semiconductor device chip, and the temperature significantly rises in a central region of the chip while the semiconductor device chip is operating. In particular, there is a problem that the temperature distribution becomes large if the thermal conductivity of the substrate to be the base of the semiconductor device chip is small.

Therefore, a material having a thermal conductivity higher than the thermal conductivity of the base material substrate 101 may be selected as a material of the destination substrate 301. For example, a ceramic substrate such as SiC, AlN, and SiN, a metal substrate such as Cu and Al, a composite metal material composed of a plurality of metals such as W, Cr, Cu, and Mo, a composite material substrate or a laminated material substrate containing a metal material layer and a ceramic material, a substrate of a material containing carbon, or the like may be used as the destination substrate 301. Making the thermal conductivity of the destination substrate 301 greater than the thermal conductivity of the base material substrate 101 allows manufacturing a semiconductor device which efficiently dissipates heat.

The temperature rise of the semiconductor device, constituted by a plurality of device elements, can be suppressed because the heat dissipation of the device element can be improved by dividing the device of semiconductor thin film layer into a plurality of device-element islands and interconnecting the plurality of device elements formed in each of the plurality of islands after the division with each other. In particular, the temperature rise of each device element can be suppressed even when the device is operated in large currents, by using a material having a high thermal conductivity as the destination substrate 301.

In manufacturing an integrated semiconductor device constituted by the plurality of device elements, the plurality of semiconductor thin film layer islands 108 formed on the base material substrate 101 may be simultaneously transferred to the destination substrate 301. The integrated semiconductor device, in which all device elements operate appropriately, can be manufactured by forming electrodes on the plurality of islands 108 transferred to the destination substrate 301 or by forming a wiring pattern for providing connections between at least one pair out of the plurality of islands 108.

[Optimization of Crystal Orientation]

Figure 10:
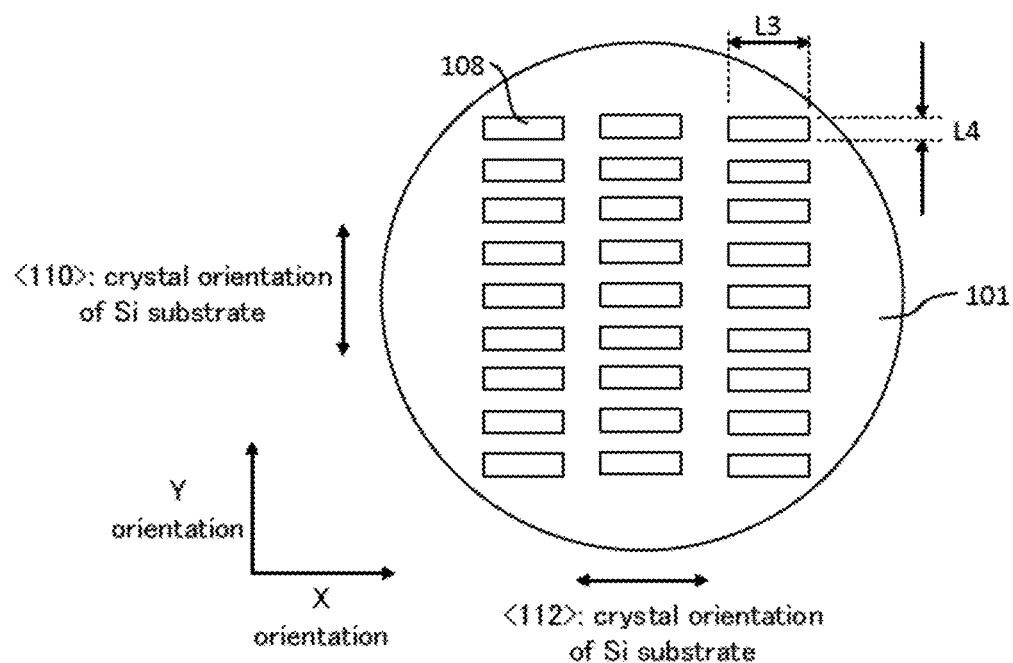
FIG. 10 schematically illustrates a semiconductor epitaxial wafer, in which a semiconductor epitaxial layer is formed on a wafer used as a base material substrate.

FIG. 10 schematically illustrates a semiconductor epitaxial wafer, in which a semiconductor epitaxial layer is formed on a wafer used as the base material substrate 101. FIG. 10 shows a plurality of group III nitride semiconductor thin film layer islands 108 formed on the Si substrate as the base material substrate 101. The orientation of the side of the island 108 is preferably within an angle range of ±45° or less with respect to the <112> orientation of the Si(111) substrate as the base material substrate 101 in order to enable the group III nitride semiconductor thin film layer island 108 to be detached from the base material substrate 101 in a good state. The orientation of the longer side of the island 108 is preferably the <112> orientation of the Si(111) substrate serving as the base material substrate 101.

Si(111) exhibits anisotropic etching properties for particular etchants. Utilizing the anisotropic etching properties of Si(111) allows the epitaxially grown semiconductor thin film layer on Si(111) to be separated from Si(111) by removing the surface region of Si(111) by etching without etching away the entire wafer. The preferred orientation of the semiconductor thin film layer island 108 formed by being epitaxially grown on the base material substrate 101 using Si(111) as the base material substrate 101 has not been known so far. However, the inventor has found that it is preferable to set the orientation of one side (for example, the longer side) of the island 108 within an angle range of ±45° or less with respect to the <112> orientation of the Si substrate. The inventor has found that it is particularly preferable to make the orientation of the longer side of the island 108 substantially parallel to the <112> orientation of the Si substrate.

Further, the inventor has found that, when the semiconductor thin film layer island 108 is formed of a hexagonal crystal, it is preferable to set the orientation of the longer side of the semiconductor thin film layer island 108 within an angle range of ±45° or less with respect to the <1-100> orientation of a hexagonal crystal material like a group III nitride semiconductor single crystal such as GaN. The inventor has found that it is particularly preferable to make the orientation of the longer side of the semiconductor thin film layer island 108 substantially parallel to the <1-100> orientation of the hexagonal crystal material.

As shown in FIG. 10, the island 108 has a side having a length L3 and a side having a length L4. Although an example where the island 108 is a rectangle whose side length L3 is longer than its side length L4 is shown below, the present invention can also be applied to a case where L3=L4 (that is, where the island 108 is a square) by treating one of the sides as a longer side.

When the island 108 is a rectangle, it is preferable to form the island 108 such that its side (longer side) having the length L3 is substantially parallel to the <112> orientation of the Si(111) substrate. Here, "substantially parallel" means parallel within a certain error or variation range, and not significantly deviated from parallel (for example, not exceeding ±10° with respect to parallel).

When crystal-growing the group III nitride semiconductor thin film layer having a C-surface ((0001) surface) on the Si(111) substrate, the <112> orientation of Si and the <1-100> orientation of the group III nitride semiconductor thin film layer crystal become parallel. In this case, it is preferable to form the island 108 such that the side of the island 108 having the length L3 is substantially parallel to the <1-100> orientation of the group III nitride semiconductor epitaxial layer crystal.

As already described, it is possible to employ a plurality of methods as the method for forming the island 108. For example, it is possible to form the semiconductor thin film layer island 108, in which the orientation of its one side is substantially parallel to the <1-100> orientation of the group III nitride semiconductor epitaxial layer crystal, by etching the crystal-grown semiconductor thin film layer.

Further, the semiconductor thin film layer island 108, in which the orientation of its longest side is substantially parallel to the <112> orientation of Si or the <1-100> orientation of the hexagonal crystal, may be formed by forming a mask layer having an opening by using an inorganic insulating film such as a $SiCO_2$ or $Si_xN_y$, on the base substrate 101 and selectively growing the semiconductor thin film layer in the opening region. Moreover, the semiconductor thin film layer island 108, in which the orientation of its longest side is substantially parallel to the <112> orientation of Si or the <1-100> orientation of the hexagonal crystal, may be formed by crystal-growing the selectively grown semiconductor thin film layer laterally on the mask layer. The semiconductor thin film layer island 108 crystal grown on the mask layer has a high-quality crystal growth region that has fewer defects than the semiconductor thin film layer crystal grown in the region outside the mask layer.

According to an experiment conducted by the inventor, when the longer side (the side having the length L3) of the semiconductor thin film layer island 108 is set to be substantially parallel to the <110> orientation of the Si(111) substrate (that is, rotating the rectangle island 108 shown in FIG. 10 by 90°), the etching of the Si(111) substrate surface directly below the device region (the semiconductor thin film layer island 108) did not proceed and the entire surface of the Si substrate directly below the island 108 could not be etched away. As a result, the islands 108 could not be detached from the Si(111) substrate used as the base material substrate 101 in a good state.

Figure 11A:
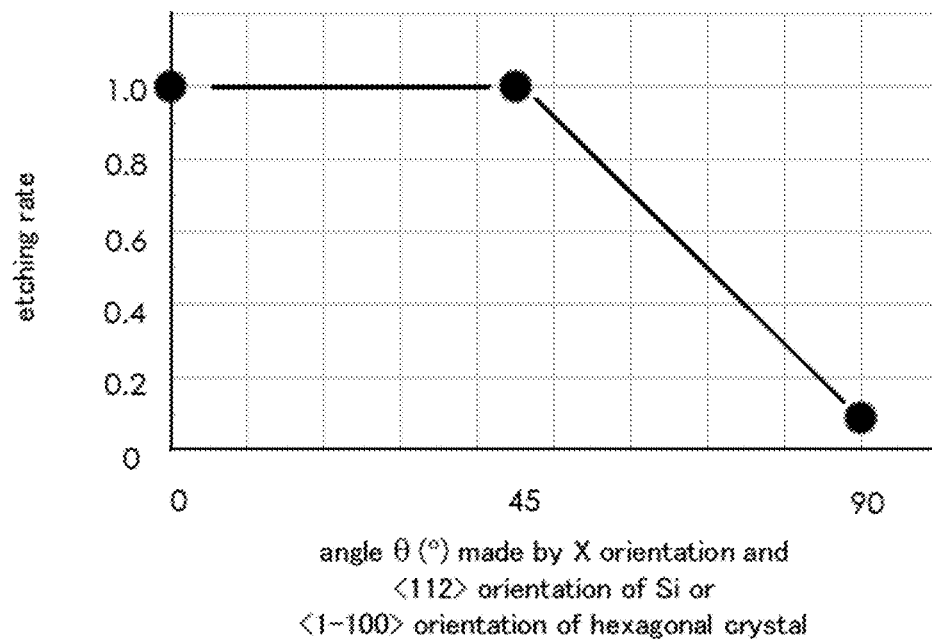
FIG. 11A shows a relation between an angle θ and an etching rate of a Si(111) substrate surface region in a direction perpendicular to the longer side of the semiconductor thin film layer island.
Figure 11B:
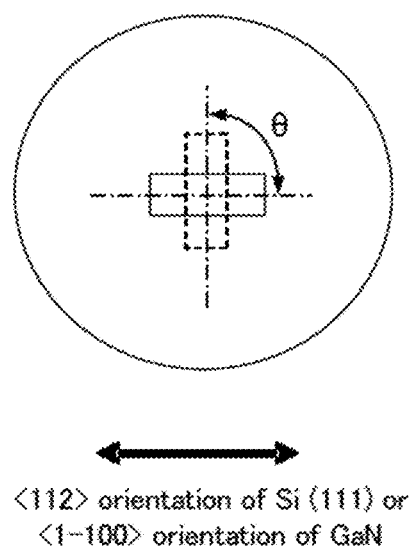
FIG. 11B is a figure for explaining the angle θ.

FIGS. 11A and 11B show a relation, investigated by the inventor in the experiment, between i) an angle θ made by the orientation of the longer side of the semiconductor thin film layer island 108 and the <112> orientation of Si(111) or the <1-100> orientation of the hexagonal crystal and ii) the etching rate of a Si(111) substrate surface region in a direction perpendicular to the longer side of the semiconductor thin film layer island 108. The vertical axis of FIG. 11A shows a value obtained by dividing the etching rate when θ=0°, 45°, and 90° by the etching rate when θ=0°. FIG. 11B is a figure for explaining the angle θ.

As shown in FIG. 11A, the etching rate for the direction perpendicular to the longer side is greatly reduced when the angle θ exceeds 45° and approaches 90°. As shown in FIG. 11A, the angle θ made by the orientation of the longer side of the island 108 and the <112> orientation of Si(111) or the <1-100> orientation of the hexagonal crystal preferably does not exceed at least 45° in order to well proceed the etching between the island 108 and the Si(111) substrate and form a void in the entire region between the island 108 and the Si(111) substrate that is directly below the island 108.

It can be confirmed from this result that the angle made by the orientation of the longer side (the side having the length L1) of the rectangular island 108 and the <112> orientation of the Si(111) substrate is desirably set to be ±45° or less in order to detach the island 108 from the Si(111) substrate in a good state by etching away the Si substrate surface over the entire surface directly below the island 108 when etching away the surface region of the Si(111) substrate over the entire surface directly below the island 108.

If the semiconductor thin film layer is the hexagonal system crystal such as a group III nitride or SiC, the angle made by the orientation of the longer side (the length L3 in FIG. 10) of the rectangular semiconductor thin film layer island 108 and the <1-100> orientation of the hexagonal crystal is desirably set to be ±45° or less. It should be noted that the semiconductor thin film layer island 108 may be made of a material having a hexagonal crystal system other than the III-nitride semiconductor and SiC, for example, ZnO.

In the above description, the semiconductor thin film layer island 108 has a rectangular shape, but if the semiconductor thin film layer island 108 has another shape, the orientation of the longest side of the semiconductor thin film layer island 108 may be substantially parallel to the <112> orientation of the Si(111) substrate (the orientation of the longest side is substantially parallel to the <1-100> orientation of the crystal of the semiconductor epitaxial layer).

Figure 12:
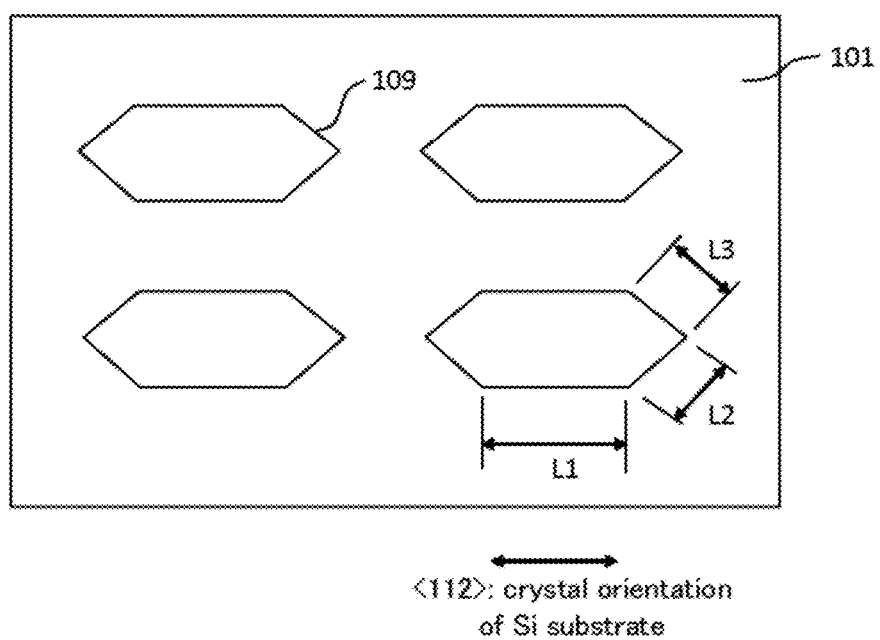
FIG. 12 shows hexagonal semiconductor thin film layer islands.

FIG. 12 shows hexagonal semiconductor thin film layer islands 109 provided on the base material substrate 101 of the Si(111) substrate. The island 109 has sides of lengths L1, L2, and L3, and satisfies the relationship of L1>L2 and L3. That is, the side having the length L1 is the longest side. The side having the length L1 of the semiconductor thin film layer island 109 is substantially parallel to the <112> orientation of Si(111), as shown in FIG. 12. In this case, when bonding the semiconductor thin film layer island 109 constituted by the hexagonal crystal on the destination substrate 301, the orientation of the side having the length L1 (that is, the longest side) of the semiconductor thin film layer island 109 is substantially parallel to the <1-100> orientation of the hexagonal crystal.

It should be noted that the base material substrate 101 may be an SOI (Silicon on Insulator) substrate. Further, the base material substrate 101 and the semiconductor thin film layer may be made of the same material. For example, if the semiconductor thin film layer is the group III nitride semiconductor, the base material substrate 101 may be a GaN substrate provided with a Si(111) layer thereon, for example. If the GaN substrate provided with the Si(111) layer thereon is the base material substrate 101, GaN may be an insulating substrate (a semi-insulating substrate or a high resistance substrate) or a conductive substrate (a substrate doped with impurities).

As another example, the base material substrate 101 may be, for example, a substrate obtained by wafer bonding the Si(111) layer on a substrate made of an oxide material such as a quartz substrate or a sapphire substrate, a nitride material such as SiN or AlN, or a semiconductor material.

<Experimental Example>

Figure 13A:
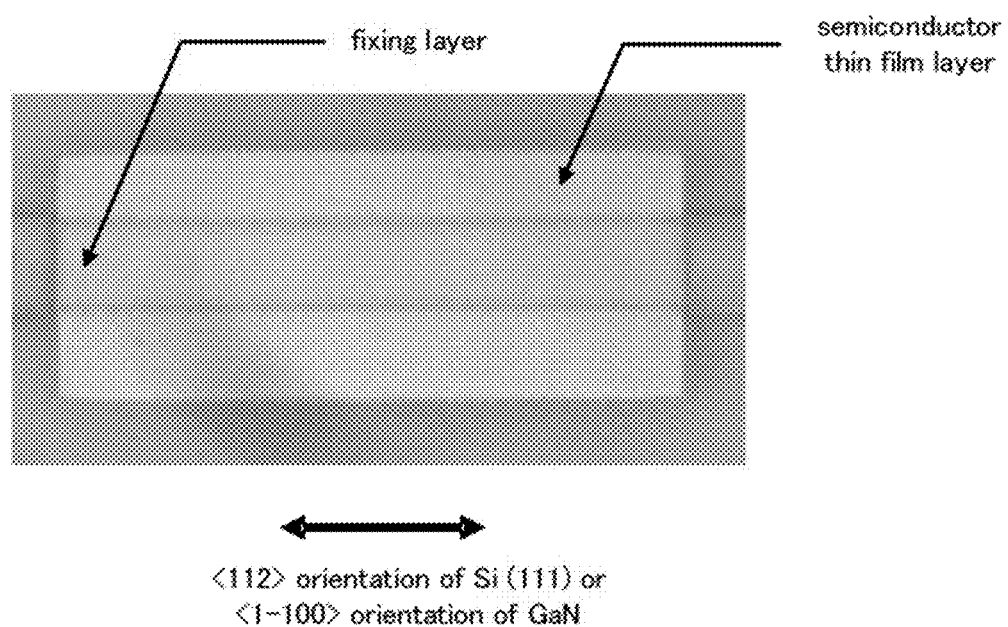
FIG. 13A is a photomicrograph of a GaN semiconductor thin film layer island formed on the Si(111) substrate as a base material substrate.

FIG. 13A is a photomicrograph of a GaN semiconductor thin film layer island formed on the Si(111) substrate as the base material substrate 101. FIG. 13A is a photomicrograph of a state in which the surface region of the Si(111) substrate, at least directly below the semiconductor thin film layer island having a longer side in an orientation substantially parallel to the <112> orientation of Si(111) or substantially parallel to the <1-100> orientation of the GaN semiconductor thin film layer, was etched away. A void is formed between the semiconductor thin film layer island and the Si(111) substrate at least in a region directly below the semiconductor thin film layer island.

Figure 13B:
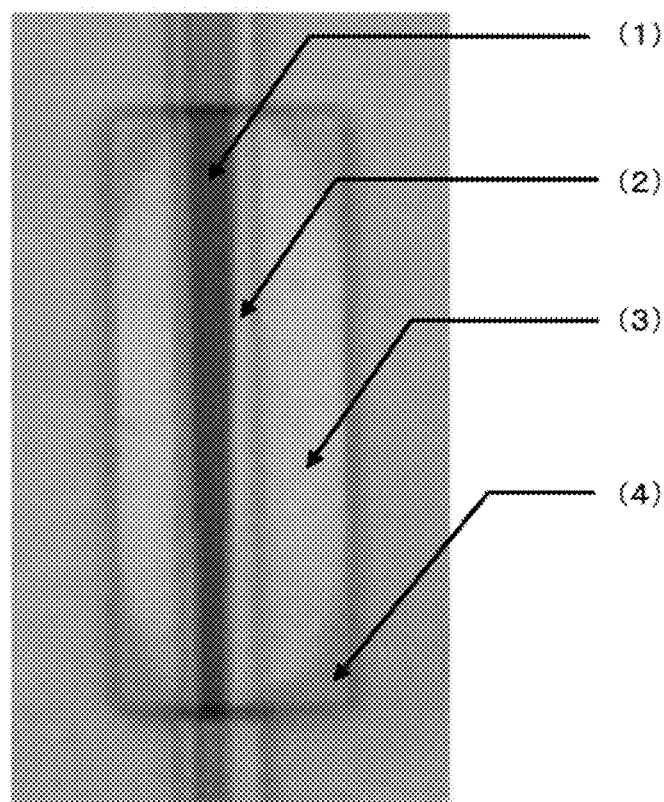
FIG. 13B is a photomicrograph of the GaN semiconductor thin film layer island in which the orientation of the longer side of the semiconductor thin film layer island with respect to a crystal orientation of the base material substrate is different from that shown in FIG. 13A.

FIG. 13B is a photomicrograph of the GaN semiconductor thin film layer island in which the orientation of the longer side of the semiconductor thin film layer island with respect to a crystal orientation of the base material substrate 101 is different from that shown in FIG. 13A. FIG. 13B shows the GaN semiconductor thin film layer island that had passed through the process of etching the surface region of the Si(111) substrate at least directly below the semiconductor thin film layer island having a longer side in an orientation substantially perpendicular to the <112> orientation of Si(111) or in an orientation substantially perpendicular to the <1-100> orientation of the GaN semiconductor thin film layer. As shown in FIG. 13B, a region where no void is formed remains between the islands of the semiconductor thin film layer and the Si(111) substrate, at least in the region directly below the semiconductor thin film layer island.

The etching time of the sample shown in FIG. 13B is about three times the etching time of the sample shown in FIG. 13A. A darkened region indicated by (1) in FIG. 13B is the region where no void is formed in the region directly below the semiconductor thin film layer island. Even if the sample shown in FIG. 13B were to be etched for a considerably long time, a region where no void is formed remains between the semiconductor thin film layer island and the Si(111) substrate directly below the semiconductor thin film layer island, as shown in FIG. 13B.

The region indicated by (2) in FIG. 13B is a fixing layer. The region indicated by (3) in FIG. 13B is a semiconductor thin film layer. In the region indicated by (4) in FIG. 13B, it was found that etching damage occurred in the semiconductor thin film layer island.

As described above, it was found from the inventor's experiment that the orientation of the longer side of the semiconductor thin film layer island was desirably substantially parallel to the <112> orientation of Si(111) or substantially parallel to the <1-100> orientation of the hexagonal crystal (the GaN semiconductor epitaxial layer) in order to form the void between the semiconductor thin film layer island and the first substrate in the entire region directly below the semiconductor thin layer island of the hexagonal crystal to separate the semiconductor thin layer island of the hexagonal crystal (for example, a stack of GaN, InN, AlN, GaN/Al$_x$Ga$_{1-x}$N/In$_x$Ga$_{1-x}$N, or the like and a semiconductor thin film layer of SiC, ZnO, or the like) from the first substrate Si(111) substrate).

Figure 14:
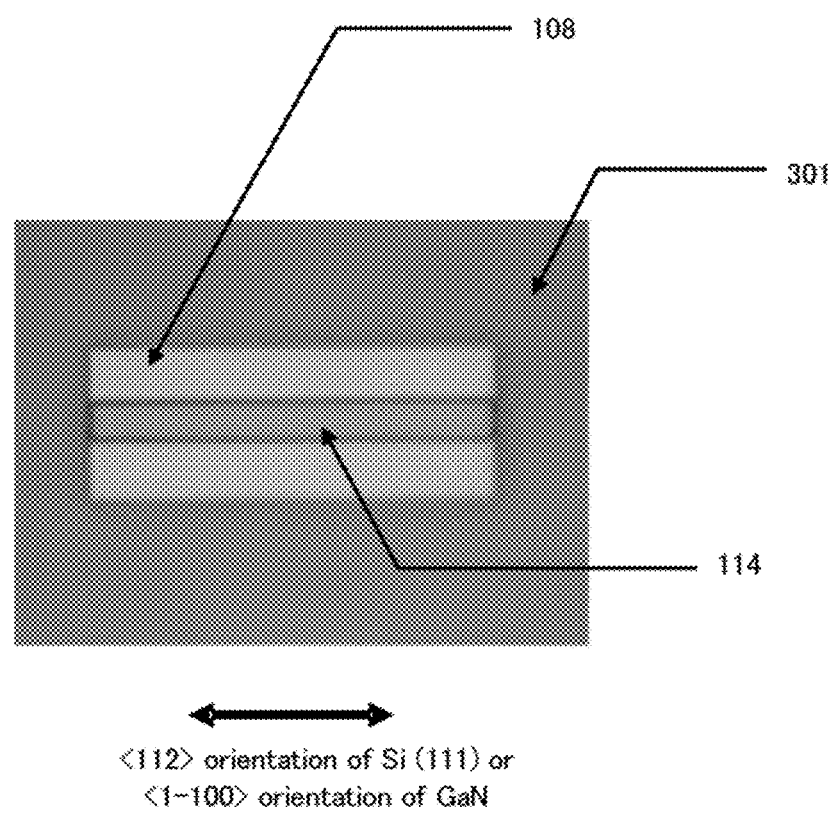
FIG. 14 is a photomicrograph of the semiconductor thin film layer island being bonded to the destination substrate, the longer side of the semiconductor thin film layer island being substantially parallel to a <1-100> orientation.

FIG. 14 is a photomicrograph of the semiconductor thin film layer island being bonded to the destination substrate 301 in the experiment performed by the inventor. The longer side of the semiconductor thin film layer shown in FIG. 14 is substantially parallel to the <1-100> orientation. There is a portion of the fixing layer 114 (a fixing layer covering partial regions of the upper surface and the shorter side surfaces of the semiconductor thin film layer island), which remains on the semiconductor thin film layer, as shown in FIG. 14.

In the photomicrograph shown in FIG. 14, neither interference fringes nor color unevenness are seen on the semiconductor thin film layer island bonded to the destination substrate 301, and it is confirmed that the semiconductor thin film layer island was well bonded to the destination substrate 301. The semiconductor thin film layer island can be bonded to the destination substrate 301 in a good state in this way for the following reasons: (1) the semiconductor thin film layer island is formed such that the orientation of the longer side of the semiconductor thin film layer island is substantially parallel to the <1-100> orientation, (2) the void is formed between the semiconductor thin film layer island and the base material substrate 101 at least in the region directly below the semiconductor thin film layer island, and (3) damage due to the etching process is not caused on the surface of the semiconductor thin film layer facing the void. Further, it is also considered that the semiconductor thin film layer island can be bonded to the destination substrate 301 in a good state because the semiconductor thin film layer island can be separated from the base material substrate 101 in a good state by separating the semiconductor thin film layer island from the base material substrate 101 in a state where the void is formed in the region directly below the semiconductor thin film layer island.

[A Method for Easily Breaking the Fixing Layer 110]

Figure 15A:
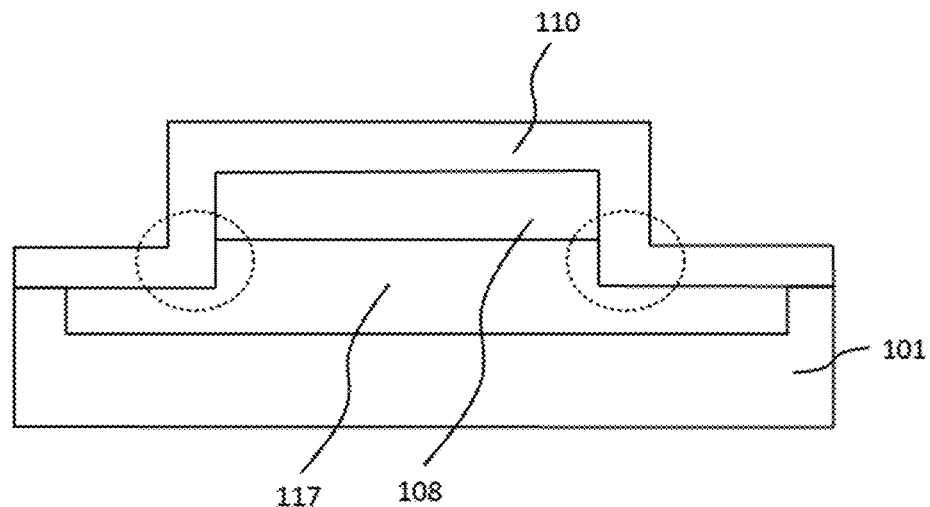
FIG. 15A is a figure for explaining a method for easily breaking the fixing layer.
Figure 15B:
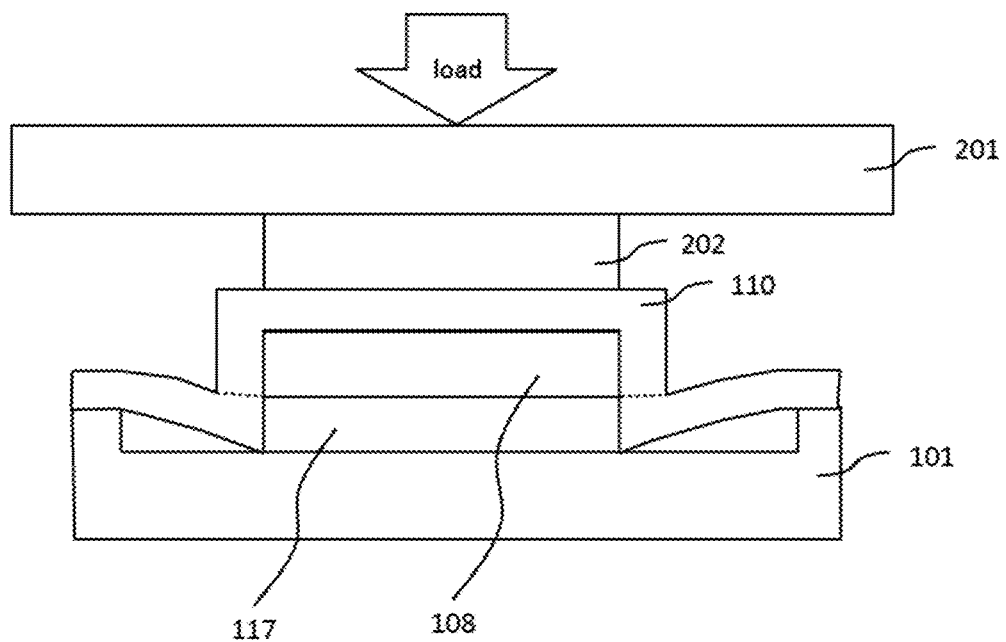
FIG. 15B is a figure for explaining the method for easily breaking the fixing layer.

FIGS. 15A and 15B are figures for explaining a method for easily breaking the fixing layer. As shown in FIG. 15A, a void 117 may be formed over a region wider than the void 103 shown in FIG. 1E in the etching process for forming the void between the semiconductor thin film layer island 108 and the base material substrate 101. The void 117 is formed between the fixing layer 110 and the base material substrate 101 in a partial region where the fixing layer 110 is formed on the base material substrate 101 in the example shown in FIG. 15A.

If a downward force is applied to the fixing layer 110 in this state, a large stress is applied to corners (ellipse portions indicated by a broken line in FIG. 15A) of the region, in the fixing layer 110, where the void 117 exists between the fixing layer 110 and the base material substrate 101, resulting in easy cracking or breaking at the broken line portions shown in FIG. 15B.

Figure 16:
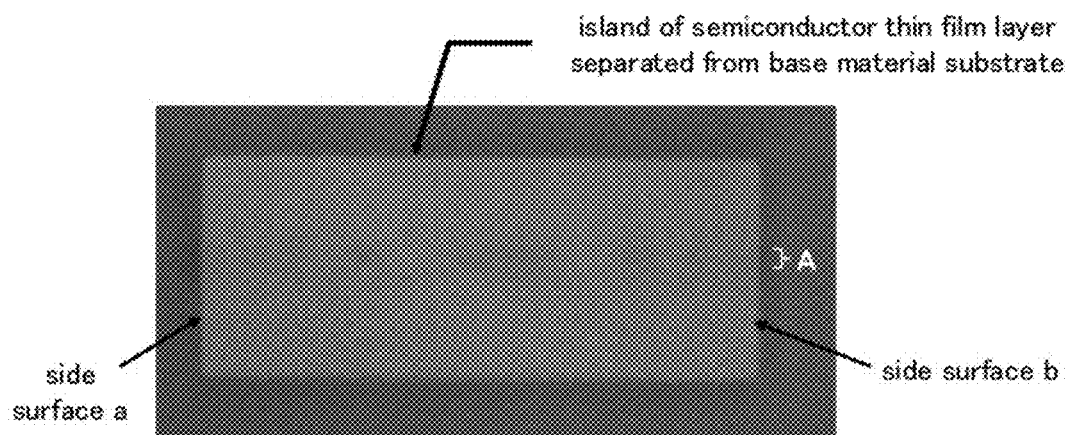
FIG. 16 is a photomicrograph showing results of observing a separation state of the fixing layer in an actual experiment.

FIG. 16 is a photomicrograph showing results of observing a separation state of the fixing layer 110 in an actual experiment. FIG. 16 is a photomicrograph of the back surface (the surface to be bonded) of the semiconductor thin film layer island 108 separated from the base material substrate 101. There is a fixing layer 110 coating partial regions of the side surfaces of the semiconductor thin film layer island 108 at a portion indicated by "A" in FIG. 16. FIG. 16 shows the back surface of the semiconductor thin film layer island and the upper surface of the fixing layer 110 is hard to see, but the fixing layer 110 having the width indicated by a bracket in the vicinity of A in FIG. 16 extends from the side surface "a" of the semiconductor thin film layer island 108 to the side surface "b" through the upper surface (the surface opposite to the surface visible in FIG. 16) of the semiconductor thin film layer island 108.

As can be seen in FIG. 16, there is no fixing layer 110 extending from side surface of the semiconductor thin film layer island 108 to the outside of the semiconductor thin film layer island 108. Further, the fixing layer 110, extending beyond the height of the back surface (the surface observed by a microscope) of the semiconductor thin film layer island 108 shown in FIG. 16, is not seen.

Figure 17:
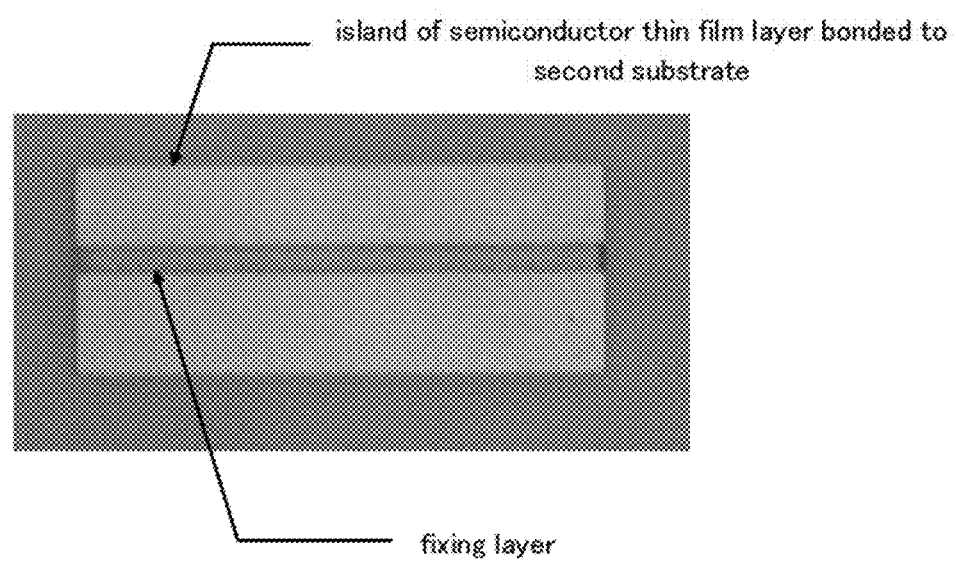
FIG. 17 is a photomicrograph of a state where the semiconductor thin film layer island separated from the base material substrate is bonded to the destination substrate.

FIG. 17 is a photomicrograph of a state where the semiconductor thin film layer island 108 separated from the base material substrate is bonded to the destination substrate 301. A portion of the fixing layer 110 remains on the upper surface and side surfaces of the semiconductor thin film layer island 108 shown in FIG. 17. The semiconductor thin film layer island 108 separated from the base material substrate 101 was well bonded to the destination substrate 301 as shown in FIG. 17.

Although the fixing layer provided on the semiconductor thin film layer island 108 is formed at a position shifted slightly upward from the center line of the semiconductor thin film layer island 108 in the photomicrographs shown in FIGS. 16 and 17, the fixing layer 110 may be formed on the semiconductor thin film layer island 108 on the center line or at a position shifted from the center line of the semiconductor thin film layer island 108. Further, the fixing layer 110 may be formed in an orientation oblique to the center line of the island 108.

Figure 18A:
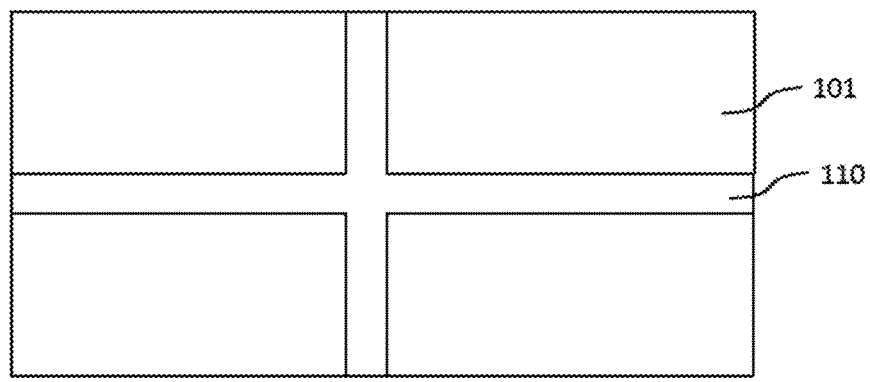
FIG. 18A shows an example of the fixing layer having a region extending in a transverse orientation.
Figure 18B:
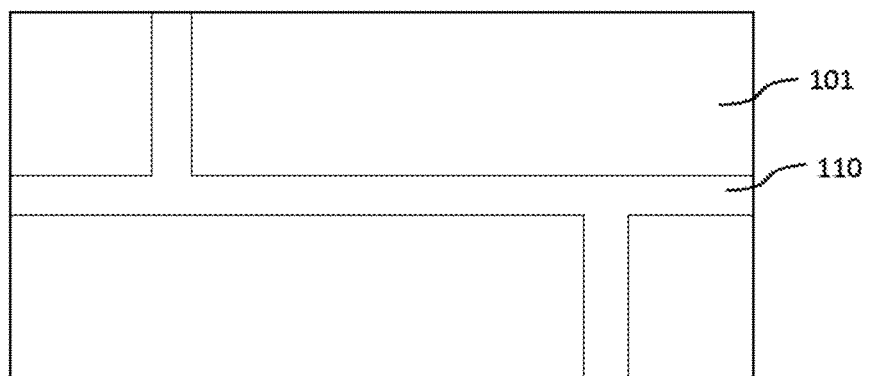
FIG. 18B shows an example of the fixing layer having a region extending in a transverse orientation.

The fixing layer 110 may have a region extending in the transverse orientation corresponding to the second orientation from at least a portion of the region extending in the longitudinal orientation corresponding to the first orientation. FIGS. 18A and 18B show examples of the fixing layer 110 having a region extending in the transverse orientation. The fixing layer 110 shown in FIG. 18A has regions extending on both sides of the fixing layer 110 from the same longitudinal position. The fixing layer 110 shown in FIG. 18B has regions extending on both sides from different longitudinal positions of the fixing layer 110.

[Formation of a Step Structure on the Semiconductor Thin Film Layer]

Figure 19A:
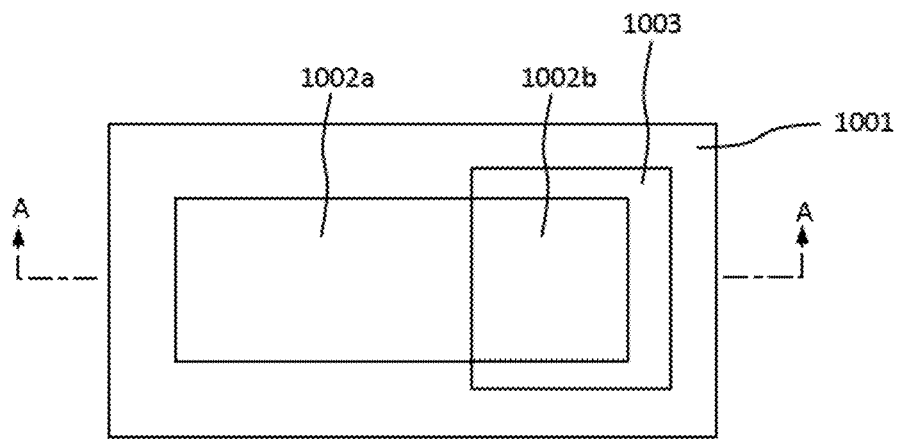
FIG. 19A is an overhead view of the base material substrate and the semiconductor thin film layer island and schematically shows a state where the semiconductor thin film layer formed on the base material substrate is divided into individual semiconductor thin film layer islands.
Figure 19B:
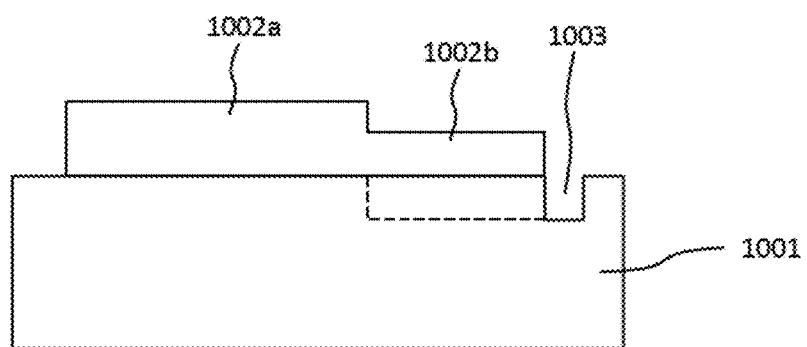
FIG. 19B shows a cross section of the base material substrate and the semiconductor thin film layer island.

When forming the device structure in the semiconductor thin film layer, a step is formed in the semiconductor thin film layer in accordance with the function of the device structure. FIGS. 19A and 19B schematically show a state where the semiconductor thin film layer formed on the base material substrate 1001 is divided into individual semiconductor thin film layer island 1002. FIG. 19A is an overhead view of the base material substrate 1001 and the semiconductor thin film layer island 1002, and FIG. 19B shows a cross section of these portions. The semiconductor thin film layer island 1002 has a plurality of regions (1002a and 1002b) having different heights.

In the process of etching away the surface of the base material substrate 1001 on which the semiconductor thin film layer island 1002 is formed to separate the semiconductor thin film layer island 1002 from the base material substrate, the periphery of the region 1002b in the base material substrate 1001 is also etched away since the region 100b is thinner than the region 1002a. Since the alignment accuracy of a mask opening part when forming a resist mask opening part prior to the etching is not ±0, a deviation occurs between the mask opening part and the outer peripheral line of the island 1002. Therefore, in order to secure a margin, the outer peripheral line of the resist mask opening part is required to be located outside the outer peripheral line of the island 1002. Consequently, a groove 1003 is formed in a region around the region 1002b as shown in FIG. 19B.

When the groove 1003 is formed, an area of a side surface region of the base material substrate 1001 directly below the region 1002b exposed to the region of the groove 1003 becomes larger than the area of the side surface region of the base material substrate 1001 directly below the region 1002a. Consequently, a partial region (the region directly below the region 1002b) of the base material substrate 1001 having a large side surface contacting the etchant is etched away faster, thereby generating a step in the base material substrate 1001 directly below the region 1002b. The step directly below the semiconductor thin film layer island 1002 causes a problem that the semiconductor thin film layer island bends at an acute angle and cracks when pushing the semiconductor thin film layer island downward (a direction toward the base material substrate). Therefore, in order to solve such a problem, forming a step structure that is not exposed to the outer periphery of the semiconductor thin film layer in the process of forming the semiconductor thin film layer is suitable for the method for manufacturing the semiconductor device by separating the semiconductor thin film layer from the base material substrate.

Figure 20A:
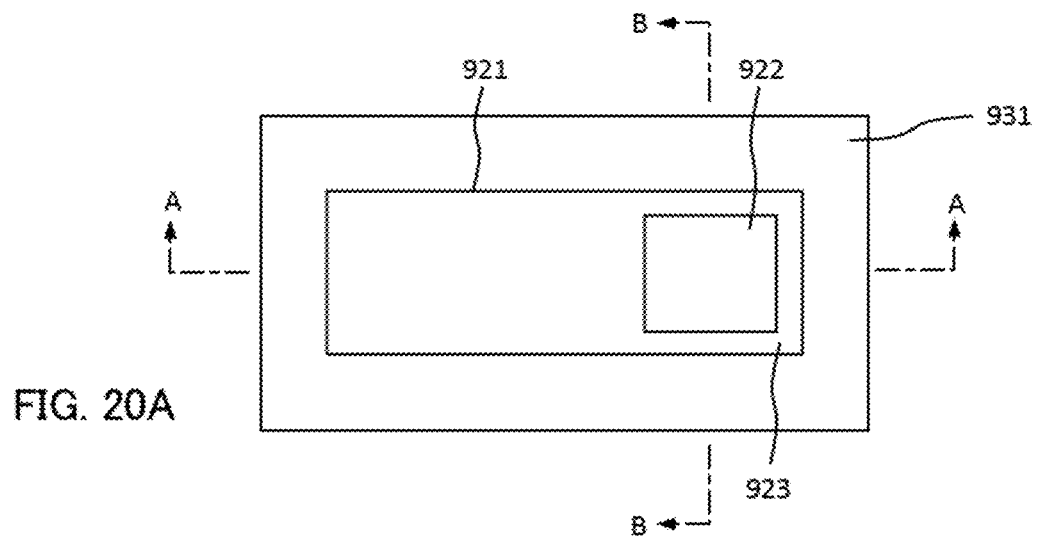
FIG. 20A is an overhead view of a semiconductor device including a semiconductor thin film layer having a step structure that is not exposed to an outer periphery of the semiconductor thin film layer island.
Figure 20B:
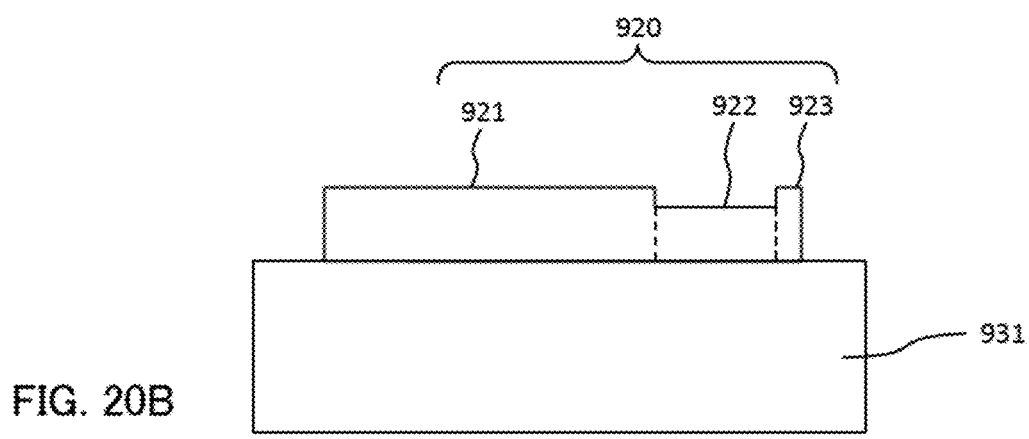
FIG. 20B shows an A-A-line cross-section of the semiconductor device shown in FIG. 20A.
Figure 20C:
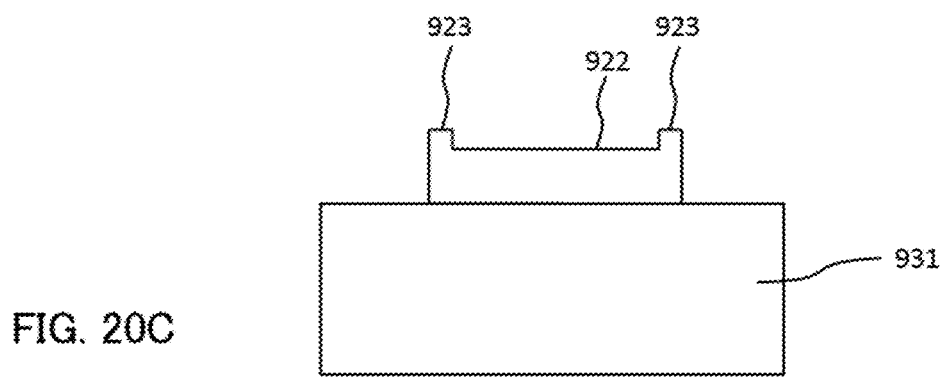
FIG. 20C shows a B-B-line cross-section of the semiconductor device shown in FIG. 20A.

FIGS. 20A to 20C show a semiconductor device including a semiconductor thin film layer island 920 including a step structure that is not exposed to the outer periphery of the semiconductor thin film layer island. FIG. 20A is an overhead view of the semiconductor device. FIG. 20B shows an A-A-line cross section of the semiconductor device, and FIG. 20C shows a B-B-line cross section of the semiconductor device. In FIGS. 20A to 20C, the semiconductor thin film layer island 920 is bonded to the destination substrate 931, the semiconductor thin film layer island 920 is including a region 921 where a p-type semiconductor layer is exposed on the surface, a concave region 922 where an n-type semiconductor layer is exposed on the surface, and an outer peripheral wall 923 where the p-type semiconductor layer is exposed on the surface.

FIGS. 21A to 21I are figures for explaining the method for manufacturing the semiconductor device shown in FIGS. 20A to 20C. Here, an LED structure is described as an example, but the present manufacturing method is not limited to a method for manufacturing a semiconductor device having the LED structure, and can be applied to a method for manufacturing a semiconductor device having various device structures.

Figure 21A:
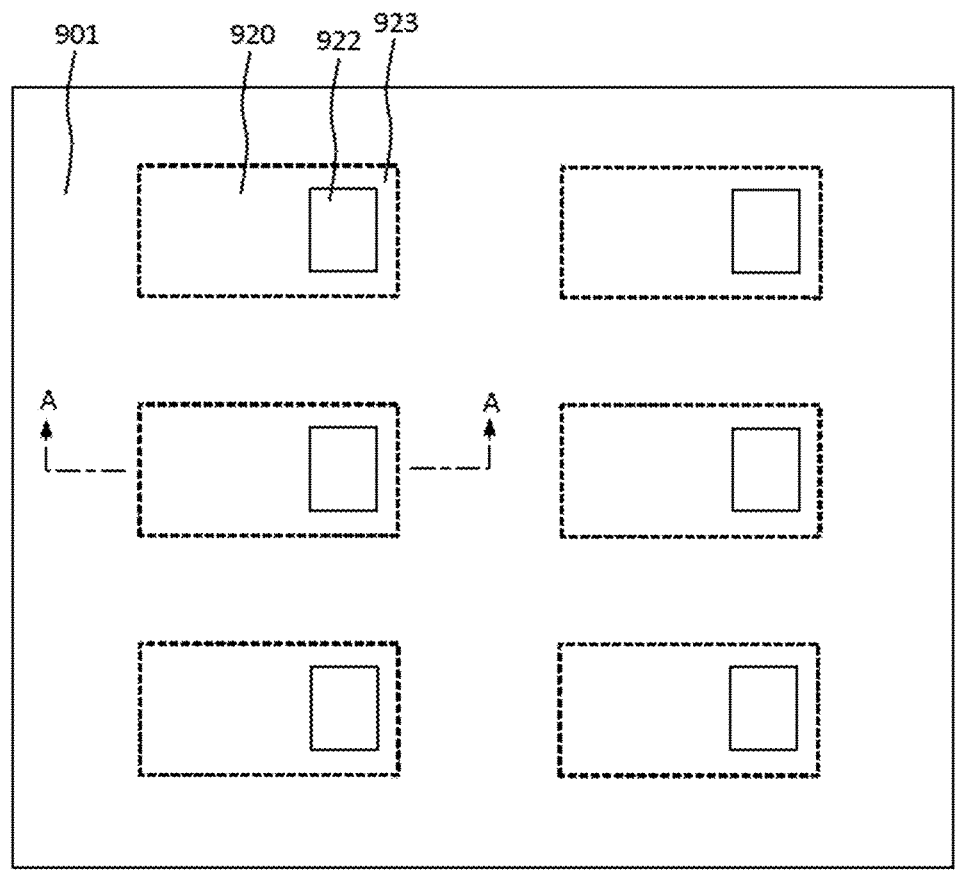
FIG. 21A is a figure for explaining a method for manufacturing a semiconductor device.

The base material substrate 901 in FIG. 21A is a base material substrate for epitaxially growing an LED semiconductor layer (for example, a laminated structure of the group III nitride semiconductor layer such as GaN) and is, for example, a Si substrate. Regions indicated by broken lines in FIG. 21A are regions where a plurality of semiconductor thin film layer islands 920 are to be formed.

Figure 21B:
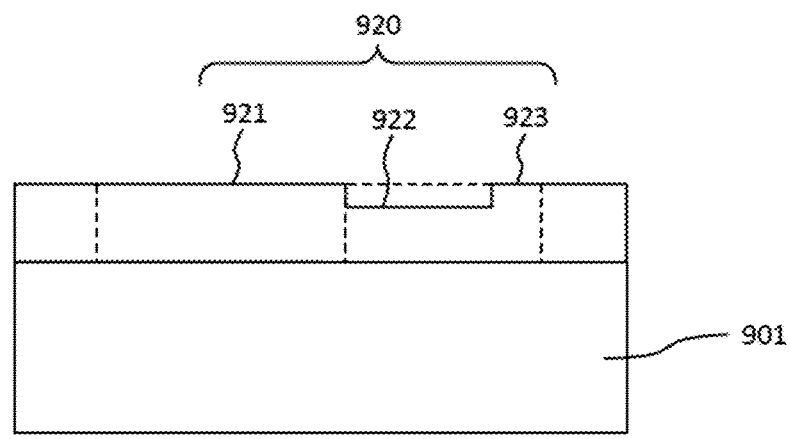
FIG. 21B is a figure for explaining a method for manufacturing a semiconductor device.

FIG. 21B is an A-A-line cross section of FIG. 21A. As shown in FIG. 21B, the semiconductor thin film layer island 920 has the region 921 where the p-type semiconductor layer is exposed on the surface, the region 922 where the p-type semiconductor layer is exposed on the surface by etching away the p-type semiconductor layer, and the outer peripheral wall 923 where the p-type semiconductor layer is exposed on the surface.

Figure 21C:
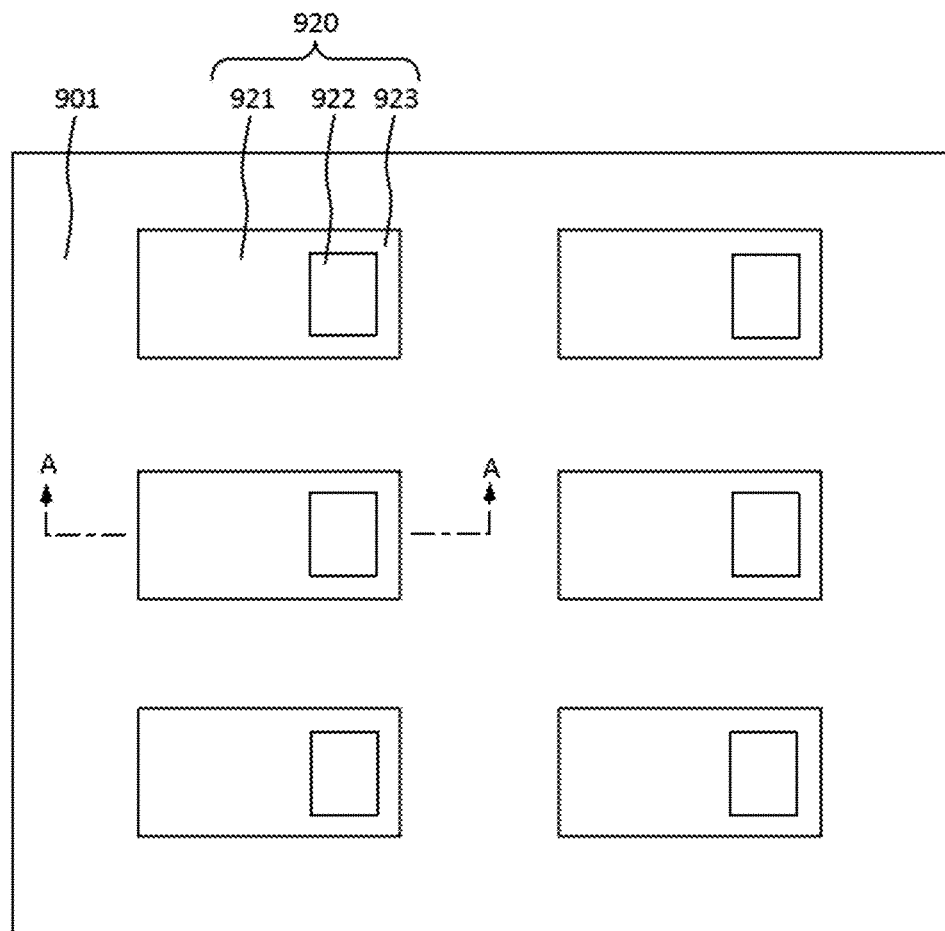
FIG. 21C is a figure for explaining a method for manufacturing a semiconductor device.
Figure 21D:
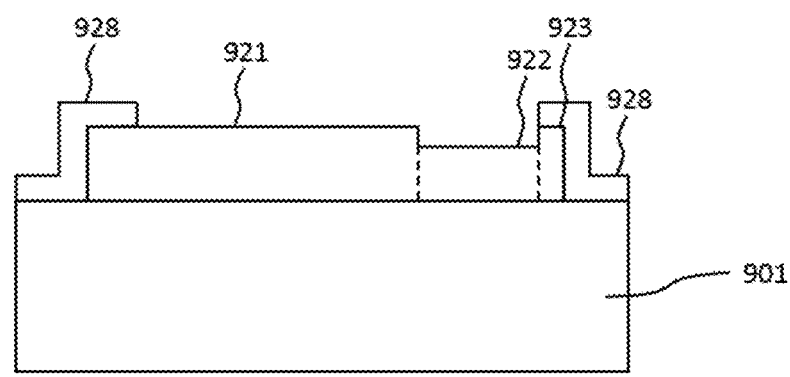
FIG. 21D is a figure for explaining a method for manufacturing a semiconductor device.

As shown in FIG. 21C, the semiconductor thin film layer is divided into individual semiconductor thin film layer islands 920 on the base material substrate 901. Subsequently, a fixing layer 928 is formed such that at least a portion of the semiconductor thin film layer island is coupled to the base material substrate 901. Here, the portion of the semiconductor thin film layer island is at least some regions of the region 921 where the p-type semiconductor layer is exposed, the region 922 where the n-type semiconductor layer is exposed, and a surface of the outer peripheral wall 923. FIG. 21D is a cross section of the periphery of the island 920 formed by the division (A-A cross section of FIG. 21C) and shows a state where the fixing layer 928 for coupling the island 920 to the base material substrate 901 is formed. FIG. 21C shows six semiconductor thin film layer islands 920, but the number, pitch, shape, size, and the like of the semiconductor thin film layer islands 920 can be appropriately designed. An outer peripheral wall 923 is provided to the region 922 where the n-type semiconductor layer is exposed such that a step is not exposed on the outer periphery of the semiconductor thin film layer island 920, and so no step reflecting the device structure of the semiconductor thin film layer island 920 is formed in the base material substrate 901 region around the semiconductor thin film layer island 920.

A standard photolithography and etching process can be applied in the process of forming the semiconductor thin film layer island 920 by etching a region of the semiconductor thin film layer other than the region where the semiconductor thin film layer island 920 is to be formed. Though not shown in drawings, after this process, an electrode contact may be formed in a partial region of the surface of the region 921 where the p-type semiconductor layer is exposed and in a partial region of the surface of the region 922 where the n-type semiconductor layer is exposed. In the formation of the electrode contact, for example, a metal thin film layer capable of forming an ohmic contact is formed, and an electrode contact sintering process can be appropriately performed in order to form an electrode contact having a low resistance.

Figure 21E:
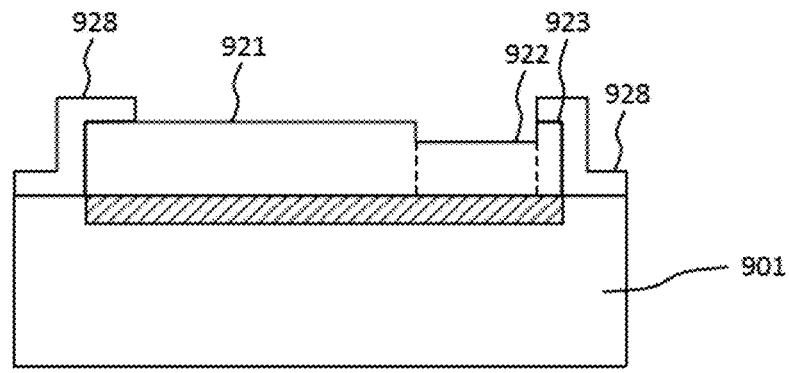
FIG. 21E is a figure for explaining a method for manufacturing a semiconductor device.

Subsequently, at least the surface region of the base material substrate 901 directly below the semiconductor thin film layer island 920 is removed by etching, as shown in FIG. 21E. In the process of etching away the surface region of the base material substrate 901 directly below the semiconductor thin film layer island 920, it is desirable to use an etchant or etching gas whose etching rate for the surface region of the base material substrate 901 is higher than that for the semiconductor thin film layer. A void (a shaded region in FIG. 21E) between the semiconductor thin film layer island 920 and the base material substrate 901 is formed in this etching process.

Figure 21F:
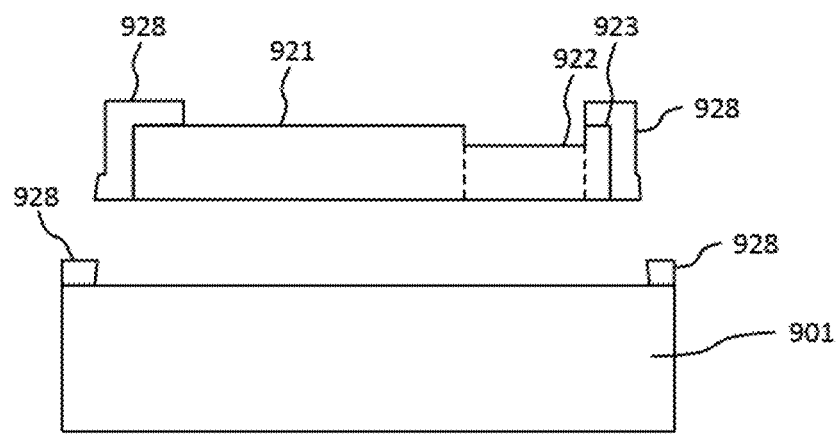
FIG. 21F is a figure for explaining a method for manufacturing a semiconductor device.

Subsequently, the semiconductor thin film layer island 920 is separated from the first substrate as shown in FIG. 21F. Though not shown in drawings, a structure (for example, the pick-up substrate described above) for temporarily adhering or adsorbing the semiconductor thin film layer island can be used in this process. In the example shown in FIG. 21F, a portion of the fixing layer 928 remains on the base material 901 after the island 920 is separated.

Figure 21G:
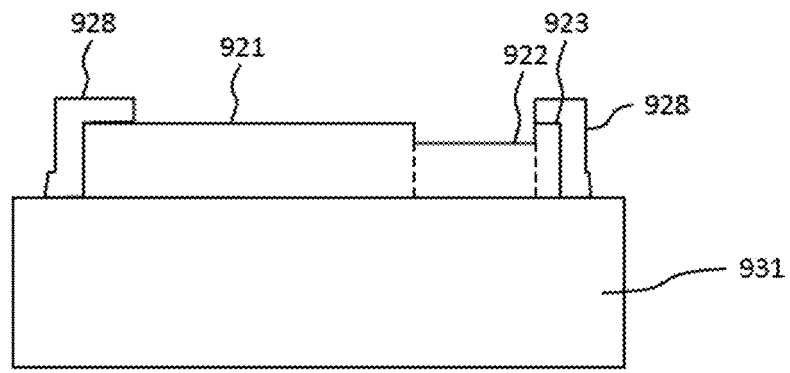
FIG. 21G is a figure for explaining a method for manufacturing a semiconductor device.

Subsequently, the semiconductor thin film layer island 920 separated from the base material substrate 901 is bonded onto the destination substrate 931 as shown in FIG. 21G. In the process of bonding the semiconductor thin film layer island 920 onto the destination substrate 931, the semiconductor thin film layer island 920 is pressed onto the destination substrate 931 without using an adhesive. Prior to the process of bonding the semiconductor thin film layer island 920 onto the destination substrate 931, a surface treatment process may be performed on the surface of the semiconductor thin film layer island 920 to be bonded and the surface of the destination substrate 931. Although not shown in drawings, another material layer may be provided between the semiconductor thin film layer island 920 and the destination substrate 931 (at least a region directly below the semiconductor thin film layer). The bonding without an adhesive is desirable in the process of bonding the semiconductor thin film layer island 920 to the destination substrate 931, but a paste or a sheet containing the adhesive may be used for bonding.

Figure 21H:
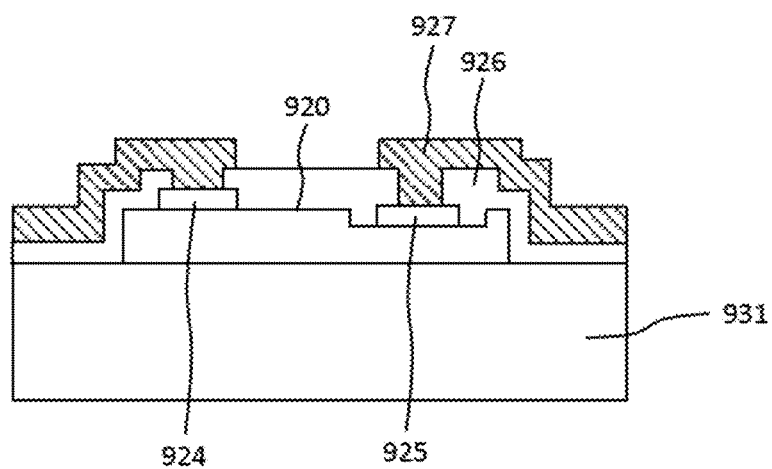
FIG. 21H is a figure for explaining a method for manufacturing a semiconductor device.

Subsequently, a structure required for the semiconductor device such as an interlayer insulating film and wiring is formal as shown in FIG. 21H after bonding the semiconductor thin film layer island 920 to the destination substrate 931. If, for example, sintering for lowering the contact resistance between the electrode and the surface of the semiconductor thin film layer island 920 is not required or the sintering temperature is low, after bonding the semiconductor thin film layer island 920 to the destination substrate 931, an aperture is formed in the fixing layer 928, an electrode 924 is formed in the region 921 where the p-type semiconductor layer is exposed in the aperture, an electrode 925 is formed in the region 922 where the n-type semiconductor layer is exposed, and a wiring layer 927 that connects the electrode 924 and the electrode 925 is formed. Further, an interlayer insulating film 926 containing a portion of the above-described fixing layer 928 may be formed. For example, the interlayer insulating film 926 may be provided on the portion of the fixing layer 928.

When the plurality of islands 920 is bonded to the destination substrate 931, the electrode 924 and the electrode 925 formed on each of the plurality of islands 920 may be connected by the wiring layer 927. The plurality of islands 920 may be obtained by dividing one single semiconductor device having a predetermined size into a plurality of small element semiconductor devices (a plurality of small islands). The plurality of small element semiconductor devices may all have the same structure and may all have the same size. This enables suppression of the temperature rise as follows.

One large semiconductor device generates a large amount of heat during operation, and in particular, the heat generated in the central region thereof is poorly dissipated, resulting in a large temperature rise in the central region. In contrast, if one single semiconductor device is divided into a plurality of small element semiconductor devices, the divided element semiconductor devices have small sizes and each element semiconductor device is connected by a wiring layer 927 of a metal material having high thermal conductivity, and so the heat generated in each element semiconductor device is efficiently dissipated through the destination substrate 931 and the wiring layer 927. As a result, the temperature rise of each small element semiconductor device is suppressed.

Further, since the plurality of element semiconductor devices, which is a semiconductor thin film layer, is bonded onto the destination substrate 931, each small size element semiconductor device can be connected by the metal thin film wiring layer, which enables high density integration. As a result, a compact semiconductor device can be obtained even when one semiconductor device is divided into a plurality of element semiconductor devices. Such a configuration is particularly suitable for a semiconductor device that allows a large current to flow, for example, a power semiconductor device using semiconductor materials such as Si, SiC, GaN, $Ga_2O_3$, and diamonds.

Figure 21I:
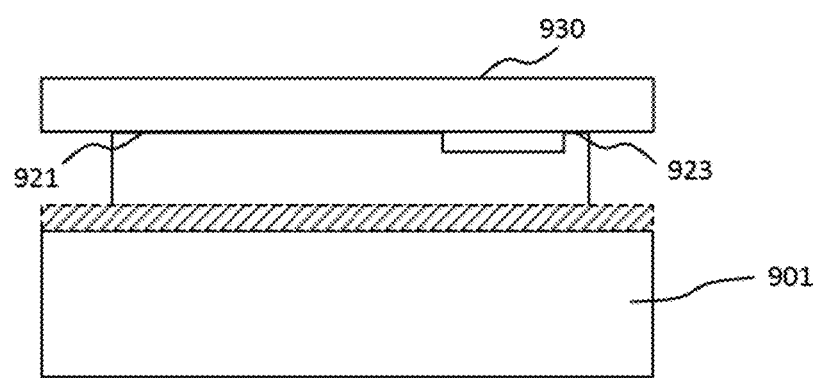
FIG. 21I is a figure for explaining a method for manufacturing a semiconductor device.
Figure 22:
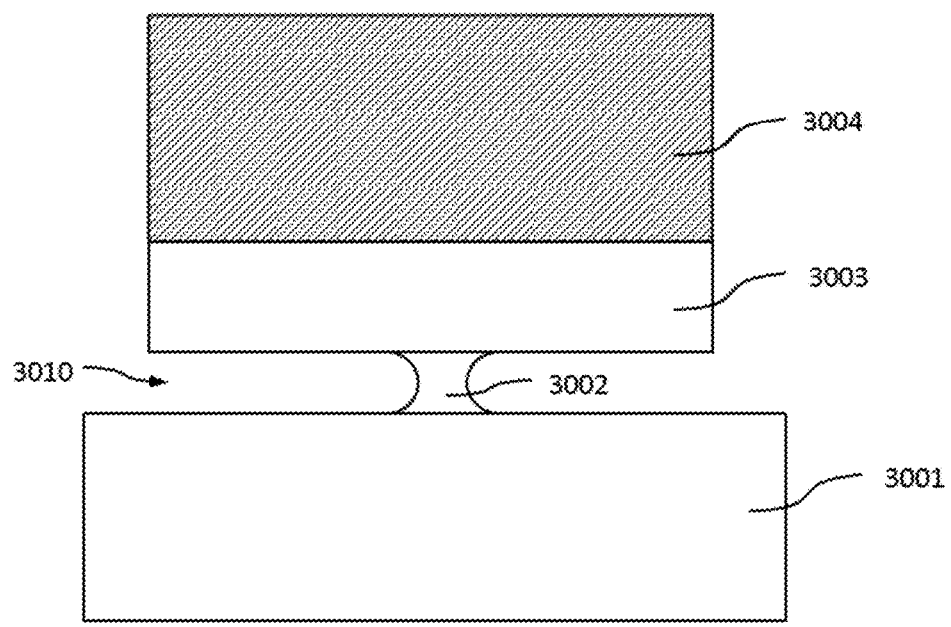
FIG. 22 is a figure for explaining the prior art.

In the method for manufacturing the semiconductor device described while referencing FIGS. 21A to 21H, the fixing layer 928 is formed in FIG. 21D, but the process subsequent to FIG. 21E may be performed without forming the fixing layer 928. In this case, for example, the island 920 may be separated from the base material substrate 901 through the following steps as shown in FIG. 21I: (1) forming the void indicated by the shaded region while fixing the pick-up substrate 930 on the surface of the island 920 (for example, the surfaces of the region 921 where the p-type semiconductor layer is exposed and the outer peripheral wall 923), and (2) pulling up the pick-up substrate 930 after forming the void. In the condition of FIG. 21I, the island 920 may be fixed by an external device other than the pick-up substrate 930.

Thus, when the fixing layer 928 is not formed, the electrode 924 is formed in the region 921 where the p-type semiconductor layer is exposed and the electrode 925 is formed in the region 922 where the n-type semiconductor layer is exposed after bonding the semiconductor thin film layer island 920 to the destination substrate 931. Further, i) the interlayer insulating film 926 covering some regions of the region 921 where the p-type semiconductor layer is exposed and the region 922 where the n-type semiconductor layer is exposed as well as having an opening where portions of the electrode 924 and the electrode 925 are exposed and ii) the wiring layer 927 connecting the electrode 924 and the electrode 925 are formed.

The present invention is explained on the basis of the exemplary embodiments. The technical scope of the present invention is not limited to the scope explained in the above embodiments and it is possible to make various changes and modifications within the scope of the invention. Further, new exemplary embodiments generated by arbitrary combinations of them are included in the exemplary embodiments of the present invention. Further, effects of the new exemplary embodiments brought by the combinations also have the effects of the original exemplary embodiments.

What is claimed is:

1. A method for manufacturing a semiconductor device in which a semiconductor thin film layer formed on a first substrate is separated from the first substrate and bonded onto a second substrate different from the first substrate, the method comprising the steps of:

forming a fixing layer that is a thin film for coupling at least a portion of a main surface of the semiconductor thin film layer on the side opposite to a first substrate side and at least a portion of the surface of the first substrate on a semiconductor thin film layer side;

coupling a third substrate different from the first substrate and the second substrate to the coupling region that is at least portions of the fixing layer and the semiconductor thin film layer;

separating the semiconductor thin film layer from the first substrate by moving the third substrate away from the first substrate with the third substrate coupled to the coupling region; and bonding the semiconductor thin film layer to the second substrate after separation from the first substrate, wherein the forming the fixing layer forms the fixing layer having a thickness such that a crack is generated between the fixing layer formed on the first substrate and the fixing layer formed on a side surface of the semiconductor thin film layer by a force for moving the third substrate.

2. The method for manufacturing a semiconductor device according to claim 1, wherein the forming the fixing layer forms the fixing layer having a thickness such that the fixing layer is cut off by a force for moving the third substrate in a direction away from the first substrate.

3. The method for manufacturing a semiconductor device according to claim 1, wherein the forming the fixing layer forms the fixing layer having a thickness such that a crack is generated in the fixing layer due to the force for moving the third substrate toward the fixing layer in the coupling is applied.

4. The method for manufacturing a semiconductor device according to claim 1, wherein the forming the fixing layer forms the fixing layer having a thickness smaller than the thickness of the semiconductor thin film layer.

5. The method for manufacturing a semiconductor device according to claim 1, further comprising the step of:

forming a void by removing a partial region of the semiconductor thin film layer or the first substrate, or a partial region of a layer between the semiconductor thin film layer and the first substrate between the forming the fixing layer and the coupling.

6. The method for manufacturing a semiconductor device according to claim 1, further comprising:

separating the semiconductor thin film layer front the third substrate by removing an organic material layer included in the third substrate and coupled to the second substrate after the bonding the semiconductor thin film layer to the second substrate.

\* \* \* \* \*